United States Patent [19]

Hustig et al.

[11] Patent Number: 4,672,605
[45] Date of Patent: Jun. 9, 1987

[54] DATA AND VOICE COMMUNICATIONS SYSTEM

[75] Inventors: Charles H. Hustig; Jeffrey L. Ward, both of Hudson, Wis.; Donald W. Moses, Minneapolis, Minn.; Robert S. Bradford, Woodland Hills, Calif.

[73] Assignee: Applied Spectrum Technologies, Inc., Minneapolis, Minn.

[21] Appl. No.: 591,509

[22] Filed: Mar. 20, 1984

[51] Int. Cl.$^4$ .............................. H04J 1/12; H04J 1/14
[52] U.S. Cl. ........................................ 370/76; 370/29; 375/1
[58] Field of Search ...................... 370/29, 69.1, 110.1, 370/68, 76; 375/1, 55; 371/37

[56] References Cited

U.S. PATENT DOCUMENTS

| | | | |
|---|---|---|---|
| 3,406,344 | 10/1968 | Hopper | 370/11 |
| 3,512,160 | 5/1970 | Meeker | 370/18 |
| 3,529,088 | 9/1970 | Hauer | 370/110.1 |
| 3,832,712 | 8/1974 | Goetz et al. | 343/17.7 |
| 3,838,444 | 9/1974 | Loughlin et al. | 178/5.2 R |
| 3,894,190 | 7/1975 | Gassmann | 179/15.55 R |
| 3,906,173 | 9/1975 | Bradley | 179/175.3 R |
| 3,916,340 | 10/1975 | Scott | 331/107 S |
| 3,956,601 | 5/1976 | Harris et al. | 179/175.3 R |
| 3,972,000 | 7/1976 | Desblache et al. | 329/105 |
| 3,980,825 | 9/1976 | Morrien | 375/55 |
| 4,171,467 | 10/1979 | Evenchik | 370/29 |
| 4,209,841 | 6/1980 | Bambara et al. | 364/200 |
| 4,231,113 | 10/1980 | Blasbalg | 375/1 |
| 4,238,849 | 12/1980 | Gassmann | 370/11 |
| 4,271,502 | 6/1981 | Goutmann et al. | 370/62 |
| 4,327,419 | 4/1982 | Deutsch | 364/717 |
| 4,352,182 | 9/1982 | Billi et al. | 371/22 |
| 4,425,642 | 1/1984 | Moses et al. | 370/76 |
| 4,425,661 | 1/1984 | Moses et al. | 375/1 |

FOREIGN PATENT DOCUMENTS

| | | | |
|---|---|---|---|
| 0100169 | 2/1984 | European Pat. Off. | 370/29 |
| 0100608 | 2/1984 | European Pat. Off. | 370/29 |

OTHER PUBLICATIONS

"Time-Shared . . . " by Inoue et al., IEEE Trans. on Comm., vol. com-29, No. 11, Nov. 1981, pp. 1565-1572.
"Two-Wire Digital . . . " by Ahamed, IEEE Trans. on Comm., vol. com-29, No. 11, Nov. 1981, pp. 1554-1564.
"A Loop Access . . . " by Bosik et al., IEEE, 1982.
"Time-Compression Multiplexing: Squeezing Digits Through Loops"; AT&T Bell Laboratories Record; Barry S. Bosik; Feb. 1984, pp. 21-25 370/29.
"PCM Toll Switching Networks using Partial-Access Pulse Shifters" by Saito et al.; Electronics and Communications in Japan, vol. 59-A, No. 7, 1976, 370/68.
Principles of Data Communication by Lucky et al., 1968 p. 281.

*Primary Examiner*—Douglas W. Olms
*Attorney, Agent, or Firm*—Dorsey & Whitney

[57] ABSTRACT

A high speed and relatively error free communications system is disclosed which enables the high speed transmission of data at a 19.2 kilobit per second rate. The data is transmitted over the same communications medium as voice transmissions, the data transmission being virtually imperceptible to the user of the analog telephone system. Connection to and from the data terminals is made through an RS232C interface. A spread spectrum technique is utilized which "whitens" the signals of the data terminal regardless of whether the terminal is idle, transmitting or receiving data. Virtual error free transmission is achieved by interleaving bits, so that noise does not destroy the data, and by error detection and correction techniques which assure that the data, as received, is identical to that transmitted. By using a variable pseudo random code, privacy of data communications are enhanced and cross-talk is substantially eliminated. The resulting system is one that can use a single twisted pair wire for transmission and is capable of transmitting data at a high rate of speed while leaving the analog voice transmission resident and unaffected on the line.

53 Claims, 25 Drawing Figures

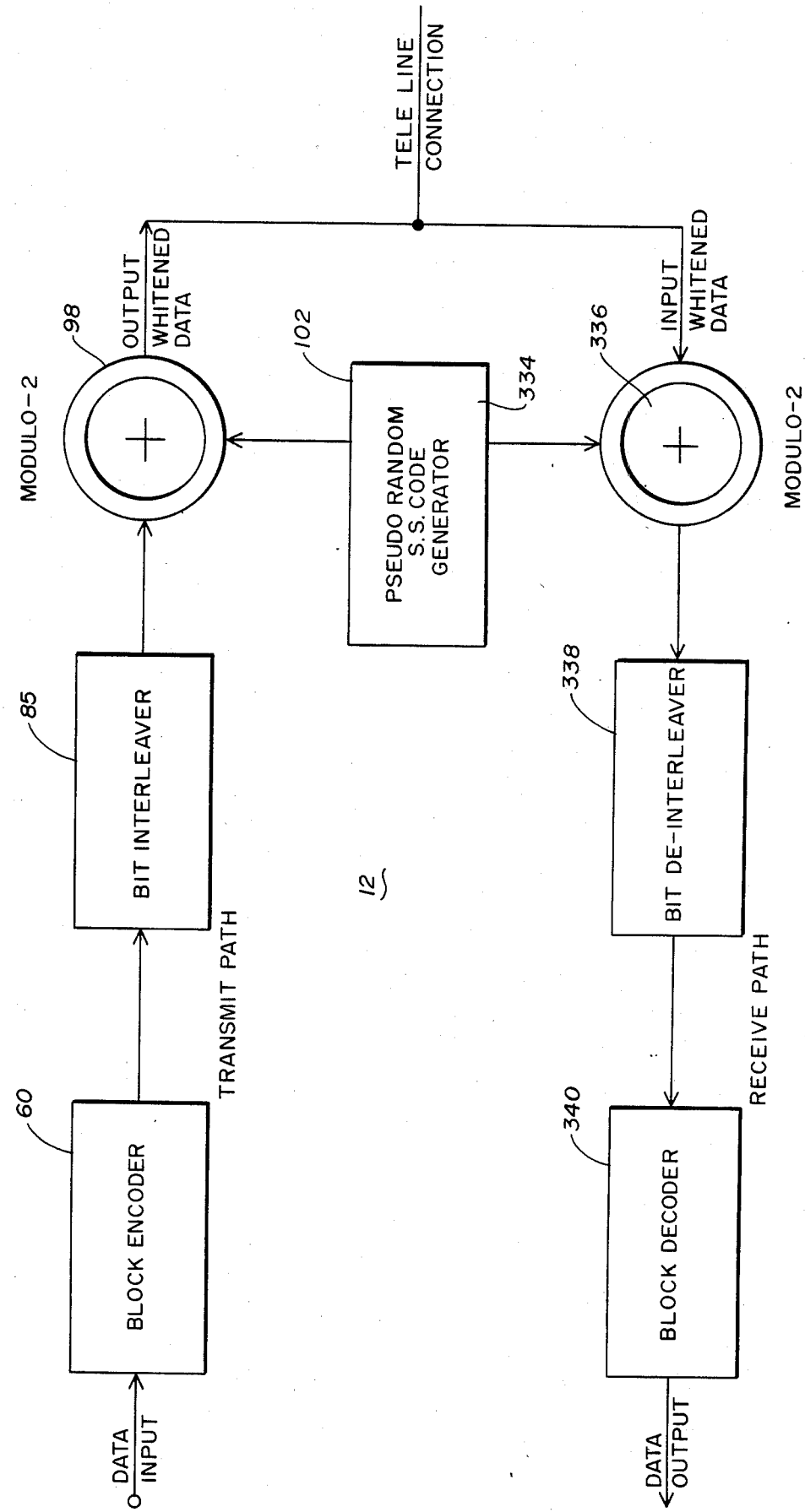

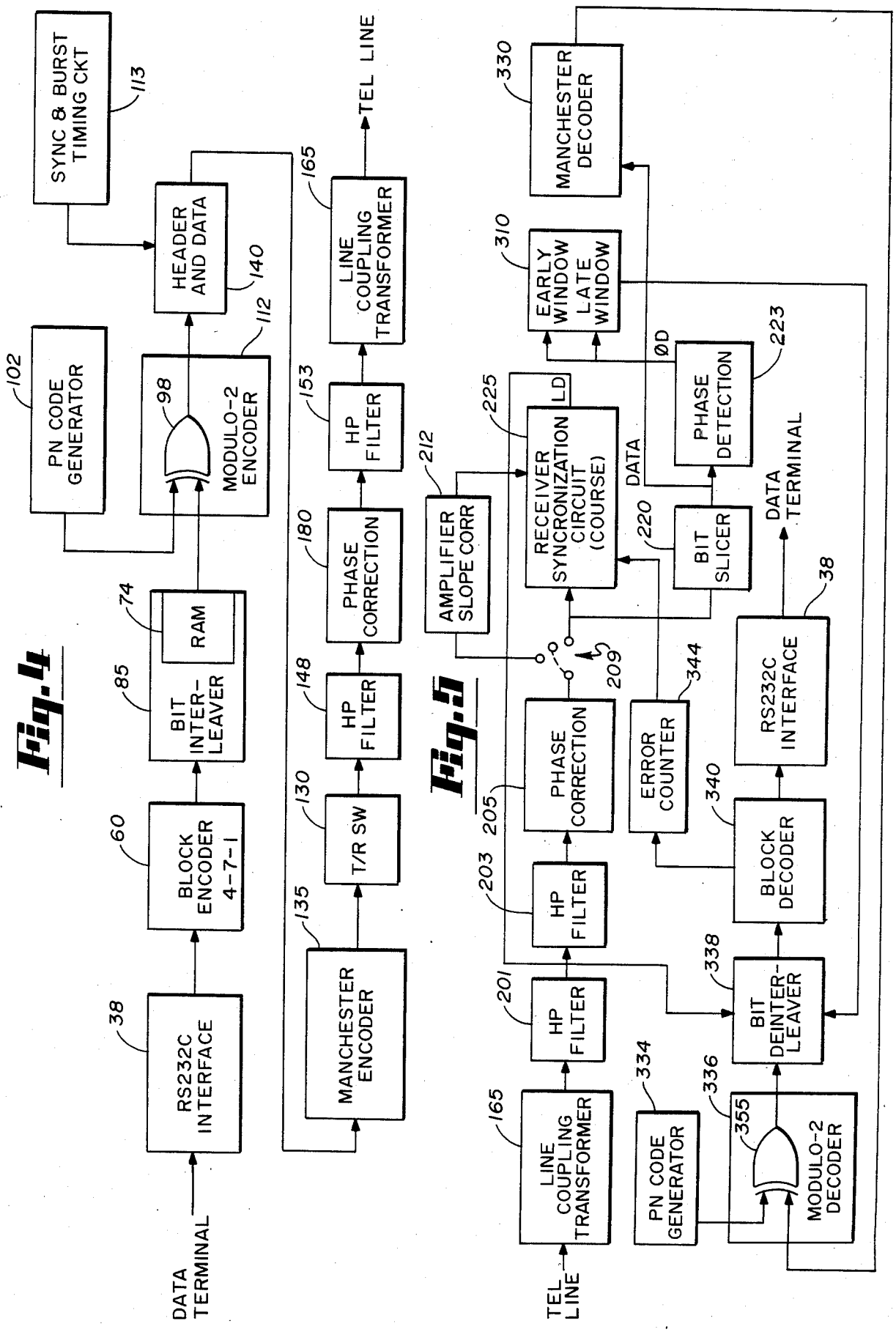

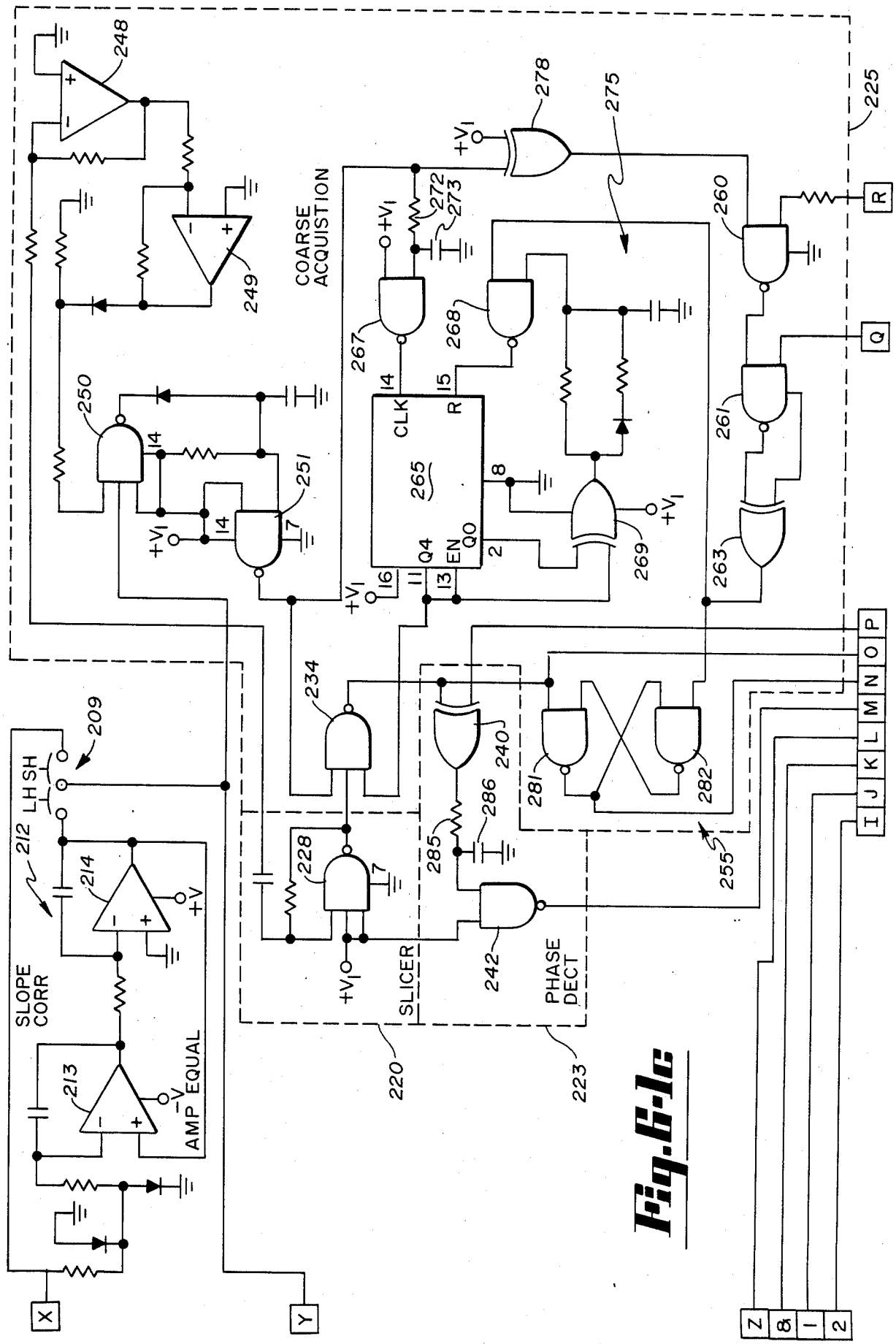

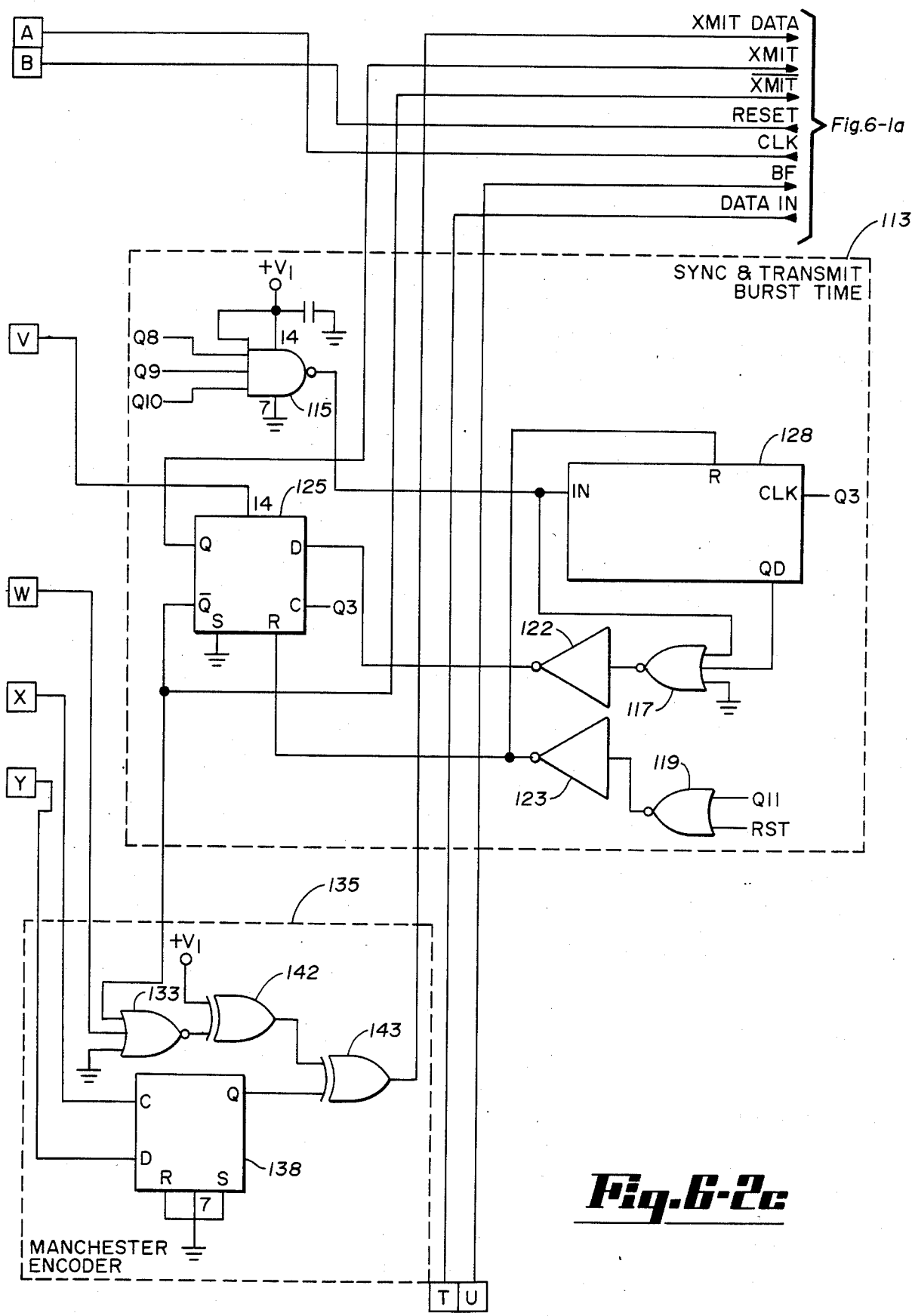

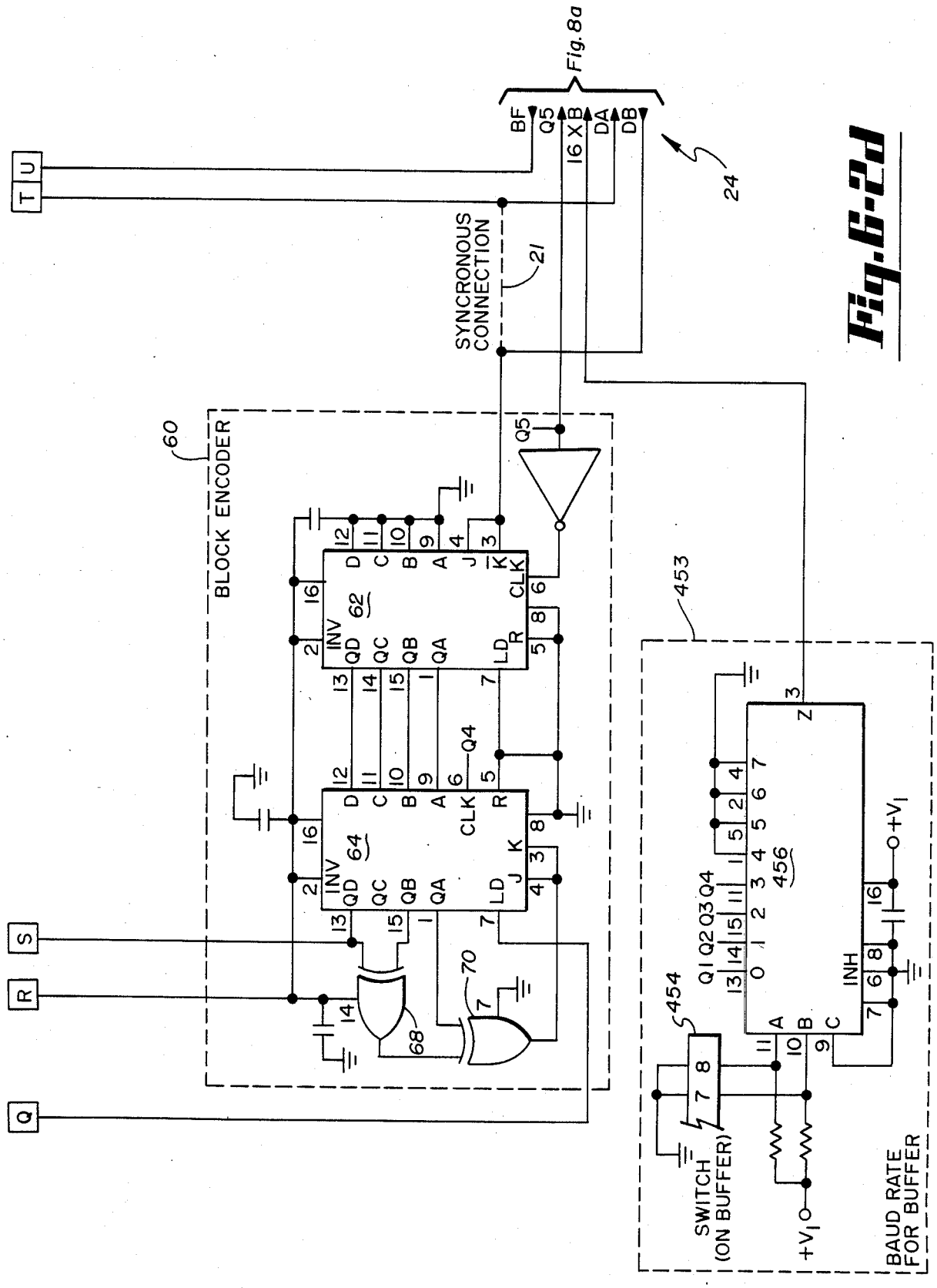

DATA AND VOICE COMMUNICATIONS SYSTEM

BACKGROUND OF THE INVENTION

The present invention generally relates to voice and data communication systems, and more specifically relates to a system where both voice and data signals are communicated on the same communications medium between a central office terminal and various subscriber terminals.

The most common method in use today of transmission of voice and data is a four wire communication system using frequency division multiplexing. However, it is often desirable to add a data signal to an existing voice or other analog information communications channel in order to transmit both signals independently and simultaneously over the same communications medium.

Attempts in the past to simultaneously transmit voice or video and data information simultaneously are represented by a number of issued patents. For example, U.S. Pat. No. 3,529,088 teaches a method of multiplexing sequential transmission of voice information and data information. Two patents, U.S. Pat. Nos. 3,894,190 and 4,238,849 teach a method of transmitting data over voice information by modulating digital message signals onto a subcarrier which lies in the ear psychological masking range of a simultaneously transmitted broadcast message. U.S. Pat. No. 3,406,344 teaches a method of modulating the voice carrier to transmit low frequency signals. U.S. Pat. No. 3,152,160 uses delay lines to transmit and detect transmitted signals which are decoded after the delay times to reconstruct the original signals. U.S. Pat. No. 3,838,444 teaches a method of altering a carrier signal which doubles the frequency of the carrier signal to indicate data transmission.

New techniques have been proposed to simultaneously transmit voice and data using a time compression multiplexing technique. However, such a time shared two wire digital subscriber transmission system, as proposed, requires the conversion of analog voice information into digital transmission and its use would require the conversion of telephone sets currently in use from analog to digital devices.

SUMMARY OF THE INVENTION

The present invention greatly enhances the use of the telephone loop system in use today. By coupling the transmitter-receiver modules of the present invention to a single unloaded pair of wires, which also service the analog telephone voice facility, and also coupling the transmitter-receiver modules to data terminals, using an RS232C interface or other suitable interface, high speed two-way data transmission is possible which is substantially error free and which does not interfere with the analog voice communications which share the two wire subscriber line. The invention has similar applicability to any other analog communications medium.

To achieve duplex operation, time compression multiplexing techniques are used. The frequency separation of the data above the voice frequency avoids interference with the analog voice communication. Spread spectrum techniques are used to minimize the effects of pair to pair cross talk. Finally, error prevention and error correction techniques are used in the transmission and receiving of data to achieve the objects and the advantages of the invention.

Data words are block encoded for transmission with seven bit code words being transmitted for each four bit data word. This encoding enables the detection and correction of errors when received.

The bits to be transmitted are interleaved so that all like bits of each code word are transmitted sequentially. Thus a noise disruption or other disruption which destroys bits during a burst will destroy only one bit of any code word, enabling the error detection and correction technique to accurately reconstruct the data word which was originally transmitted.

Using a spread spectrum technique for transmission, consisting of a subscriber selected, pseudo random code and modulo-2 transmission, provides privacy for any subscriber since each subscriber can select its own pseudo random code. The spread spectrum technique further whitens all data transmission, including an all zero and all one transmission from an idle or disconnected terminal, so that the effects of pair to pair high frequency cross talk in multipair cables, such as occurs with frequency shift keying and other common data over voice transmission schemes, is minimized. A header is added to each data burst for synchronization purposes and the transmitted data is Manchester encoded for transmission.

The received data is filtered to eliminate voice frequencies and phase corrected. A coarse acquisition circuit is used to identify the presence of a burst of data. If a valid data burst is identified, the phase of the data is controlled and the data is recovered by decoding the Manchester code, de-interleaving the bits, and recovering the four bit data word from the seven bit code word transmitted with a block decoder, which identifies and corrects any errors which occur during transmission. Error rates are monitored to assure, to the extent possible, error free transmission. The decoded data word is connected to the terminal for display.

The present invention enables the bidirectional transmission of data on a conventional two wire telephone system either when the telephone system is in use, or when it is not in use. The present invention does not require the conversion of conventional and standard telephone sets from analog to digital. The data transmission occurs at frequencies above the voice frequency of zero to three kilohertz. A time shared bidirectional data transmission at a 19.2 kilobit per second rate, is achieved in the thirty to one hundred twenty kilohertz frequency range. To achieve the 19.2 kilobit per second data rate, sixty-four data bits must be transmitted and received every three and one-third milliseconds. This is accomplished with a time compression multiplexing technique which enables the transmission of data in both directions, in data bursts, during each three and one-third milliseconds. One hundred sixteen encoded bits are transmitted on the line in both directions in timed sequence at a 76.8 kilobit per second rate, code bits being transmitted with a header or sync word preceding each transmission and with a switching interval of ten to sixteen bits separating the transmissions.

These and other advantages, features and objectives of the invention, and the manner of attaining them, will become more apparent and the invention itself will best be understood by reference to the following description of the embodiments of the invention in conjunction with the accompanying drawings.

DESCRIPTION OF THE DRAWINGS

FIG. 4 is a detailed block diagram of the transmitter portion of the modem.

FIG. 5 is a detailed block diagram of the receiver portion of the modem.

FIGS. 6-1a through 6-1e show the input-output logic, FIGS. 6-2a through 6-2d show the transmitter logic and FIGS. 6-3a through 6-3f show the receiver logic.

FIG. 7 shows a gate array which can be used with LSI circuitry as an alternative embodiment to decode and correct the block encoded code words.

DESCRIPTION OF THE PREFERRED EMBODIMENT

Figure 1:
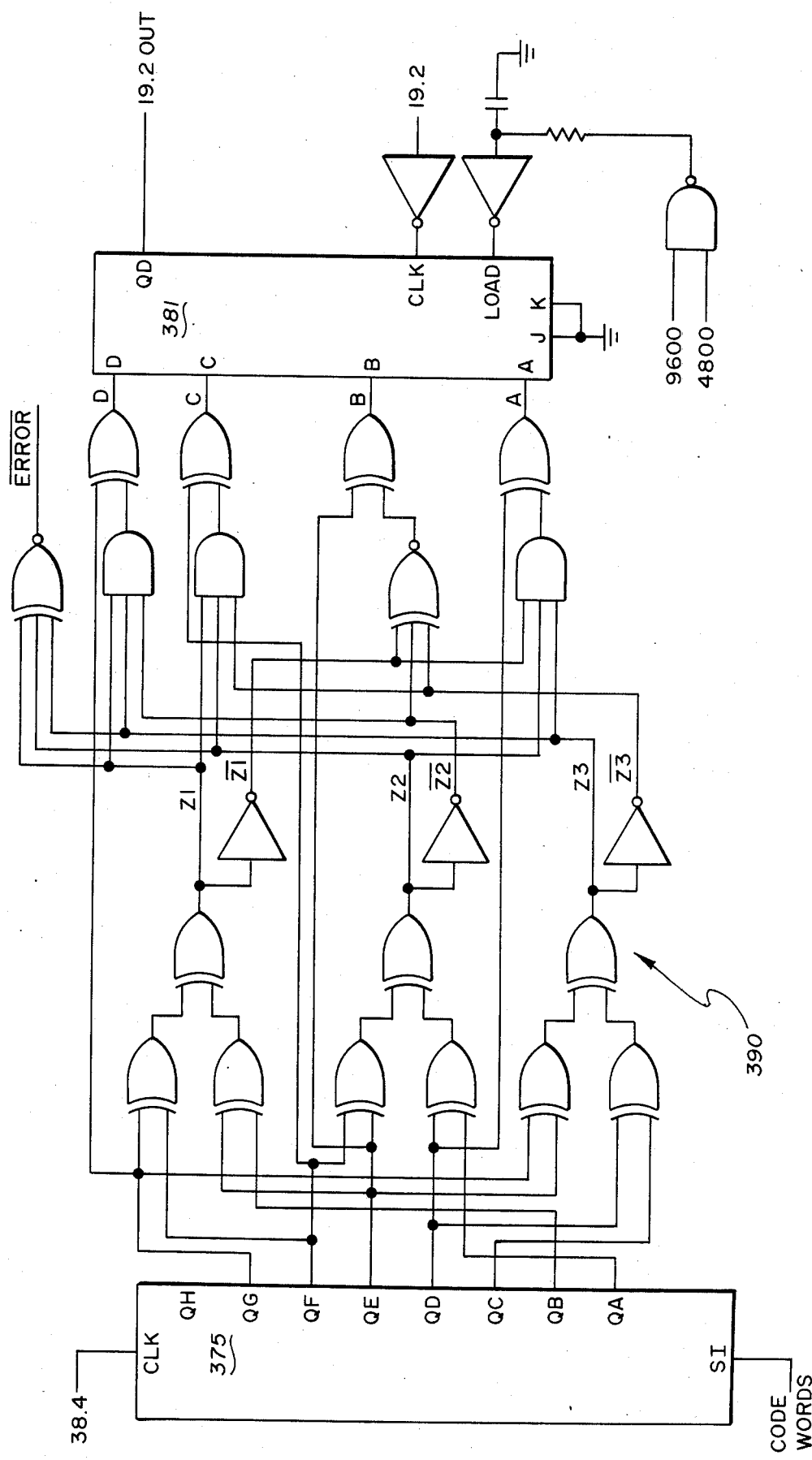
FIG. 1 is a simplified block diagram of the data modem of the present invention, one of which is used at each end of the unloaded telephone line.
Figure 8A:
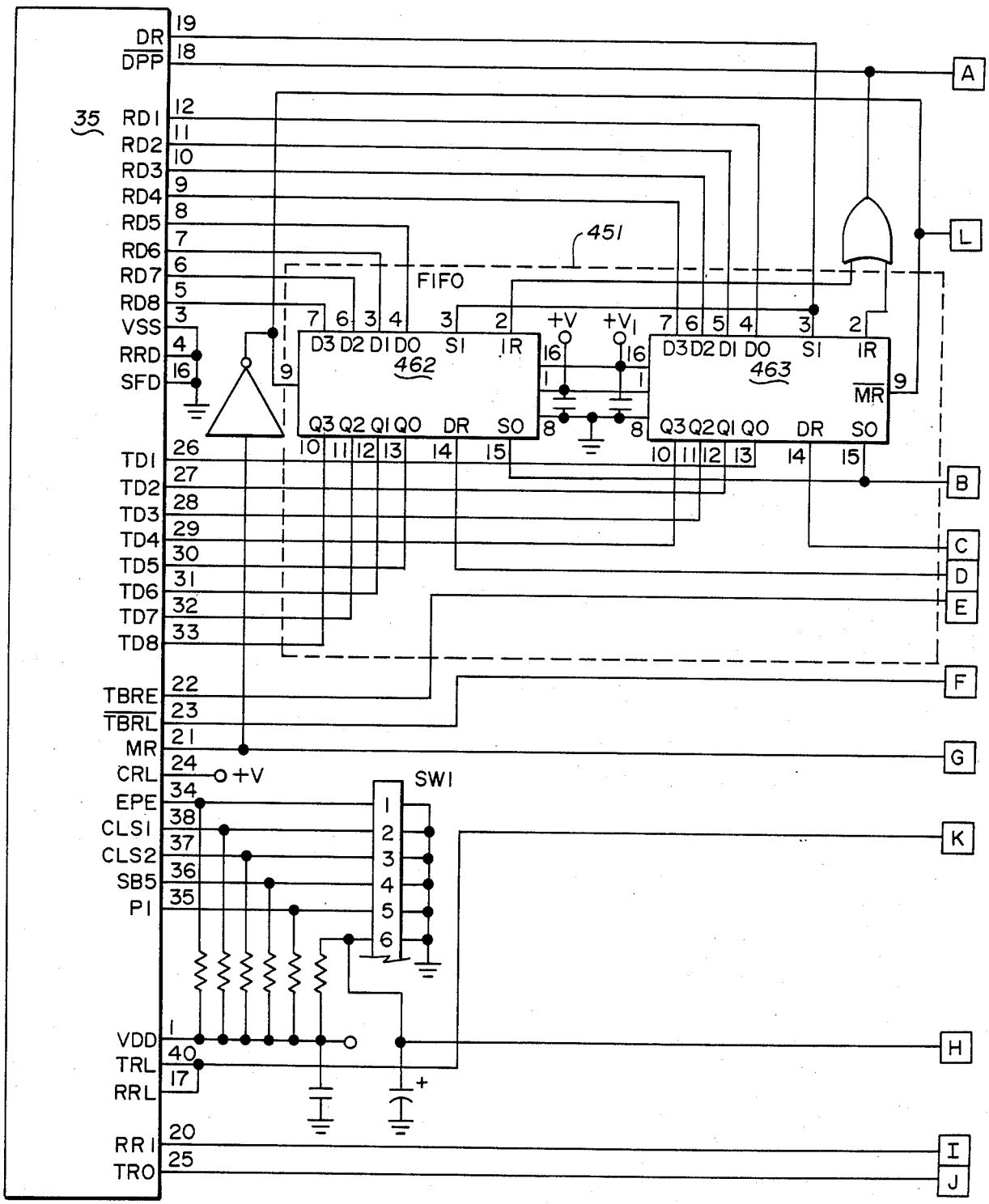
FIGS. 8a and 8b are schematic diagrams of a UART and data buffer which is used with the modem to receive and transmit asynchronous data.
Figure 8B:
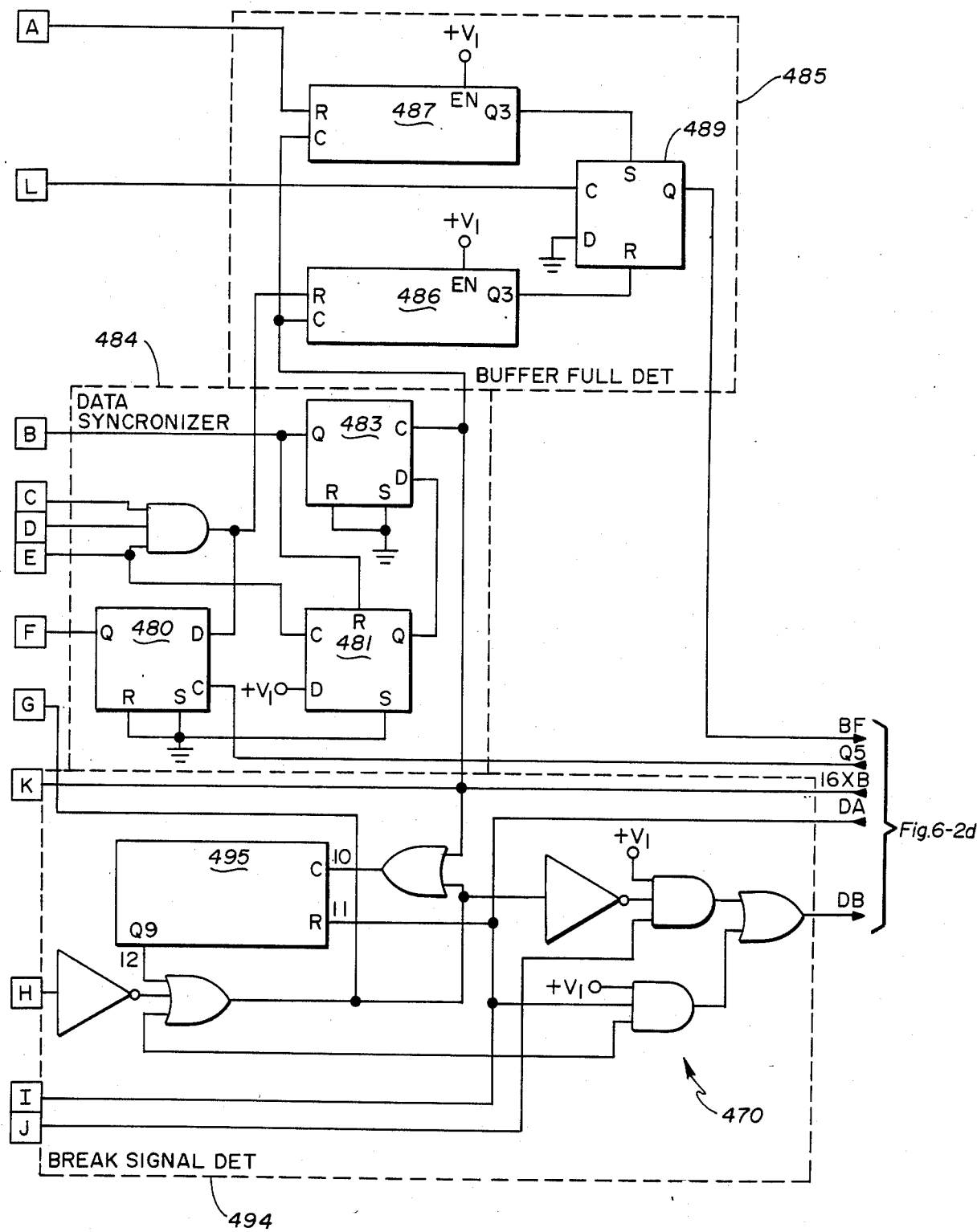

FIG. 1 shows a simplified block diagram of a data multiplexer system modem 12 of the instant invention. The modem 12 is coupled to the telephone line tip and ring terminals with a line coupling isolation transformer and the connections to transmit and receive data, labeled "data input" and "data output", are preferably connected to data terminals using a standard RS232C interface. The modem 12 transmits and receives data in the thirty to one hundred twenty kilohertz frequency band. The encoded data transmission is thoroughly whitened using spread spectrum techniques. Consequently, the high speed data transmissions on adjacent cable pairs experience little interaction. Data transmissions can occur when the telephone is not in service or when the telephone is in service. And when the telephone is in service the transmission of data or status of the data terminal is virtually undetectable by the user of the telephone.

The whitening of the data is accomplished with a spread spectrum technique including a modulo-2 addition of the data signal with a spread spectrum type pseudo random code. This prevents a string of marks or spaces, which are normally issued from a standard RS232C terminal interface, from generating strong, single frequency tones, as would occur, for example, in a straight FSK, PSK or AM scheme. Such high level single frequency tones have the tendency to bleed over onto all the pairs in a binder group causing the possibility of cross-talk interference and even capture of like systems on adjacent pairs.

Operating with a dynamic range in the order of fifty-five dB, with adjacent cable pair cross-talk coupling rejection on the order of sixty dB is expected to be a problem and concern as penetration of data services grows over the years. It can be shown that straight FSK, PSK or AM modulation schemes should only be used under these conditions with penetrations of less than five percent. Even greater caution will have to be exercised where the cable density is high or where paper and pulp cable could be water-soaked or oil-soaked.

Using the instant invention full duplex data transmission is achieved with synchronous transmission to 19.2 kilobits per second (Kbps) and asynchronous transmission to twenty-four hundred (bps). Half duplex data transmission can be achieved at fifty-six Kbps synchronous transmission.

The whitening of data, discussed more fully below, using the pseudo random spread spectrum technique not only minimizes cross-talk but also assures transmission privacy since each user may be assigned a different pseudo random code. Finally, the resulting system has a high tolerance to line transients. This is achieved with bit interleaving and forward error correction which, when combined, provide virtually error-free transmission. The error rate using these techniques is less than one in a billion bits ($10^{-9}$).

Figure 6:
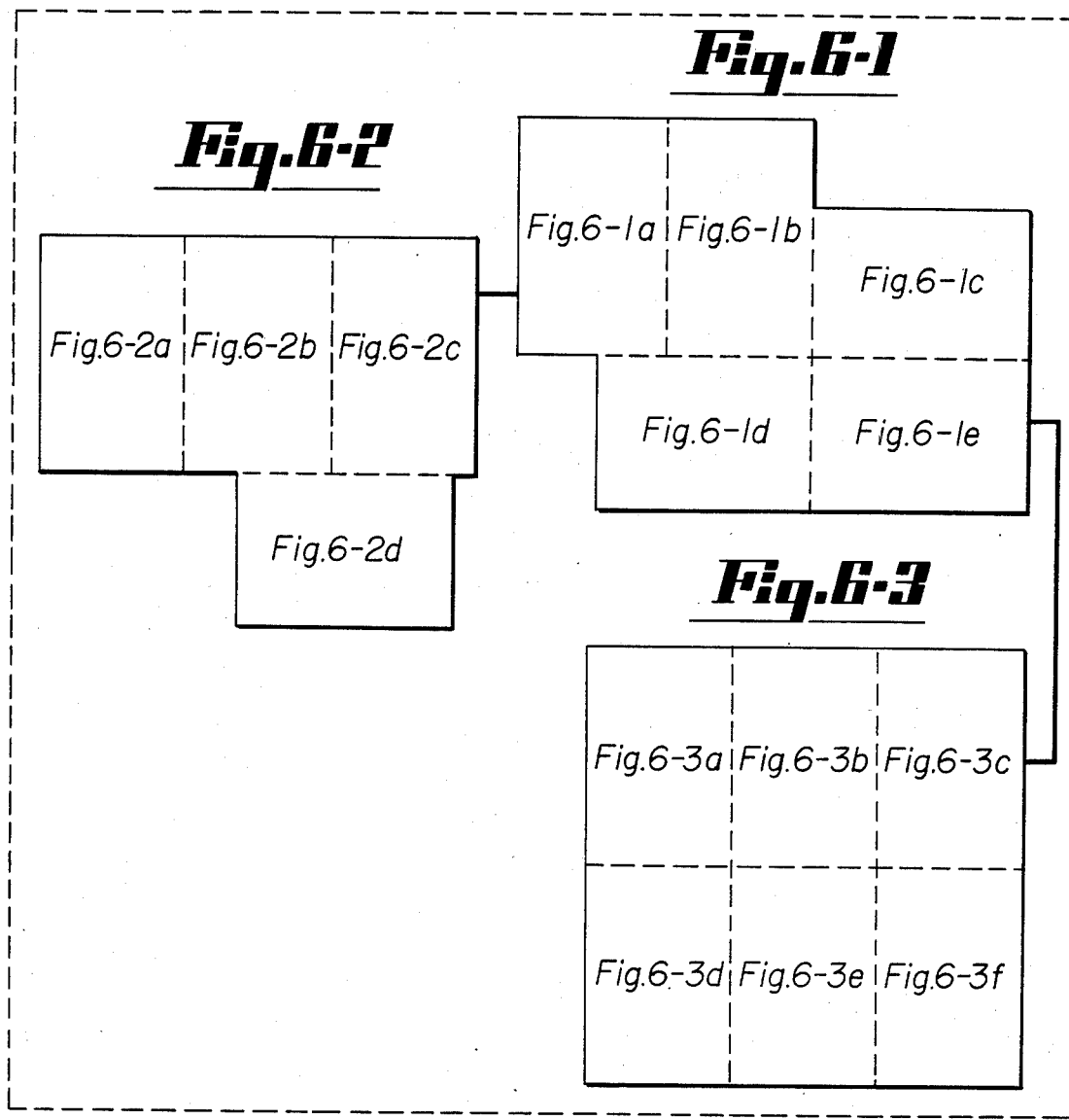
FIG. 6 is the layout of the schematic diagrams shown in FIGS. 6-1a through 6-1e, FIGS. 6-2a through 6-2d and FIGS. 6-3a through 6-3f.

A complete understanding of the invention and its operation can be gained from a review of the detailed schematics of FIG. 6 in conjunction with the simplified block diagram of FIG. 1 and more detailed block diagrams of FIGS. 4 and 5.

In the preferred embodiment of the invention a transmitter-receiver modem 12 is located at each subscriber location. A corresponding and separate transceiver 12 is located at the central office terminal for each subscriber on the system.

Figures 1A, 6:
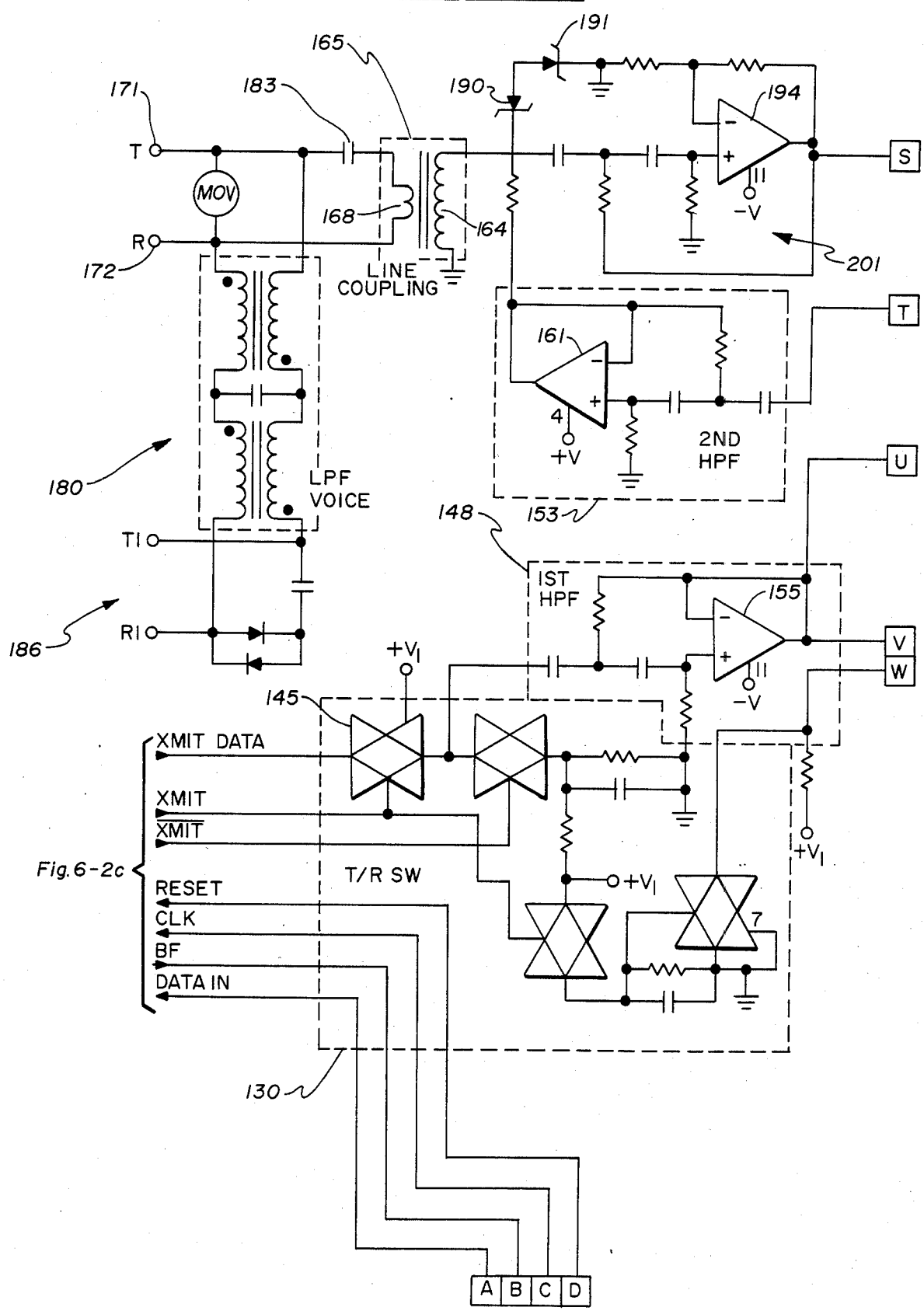
Figures 1B, 6:
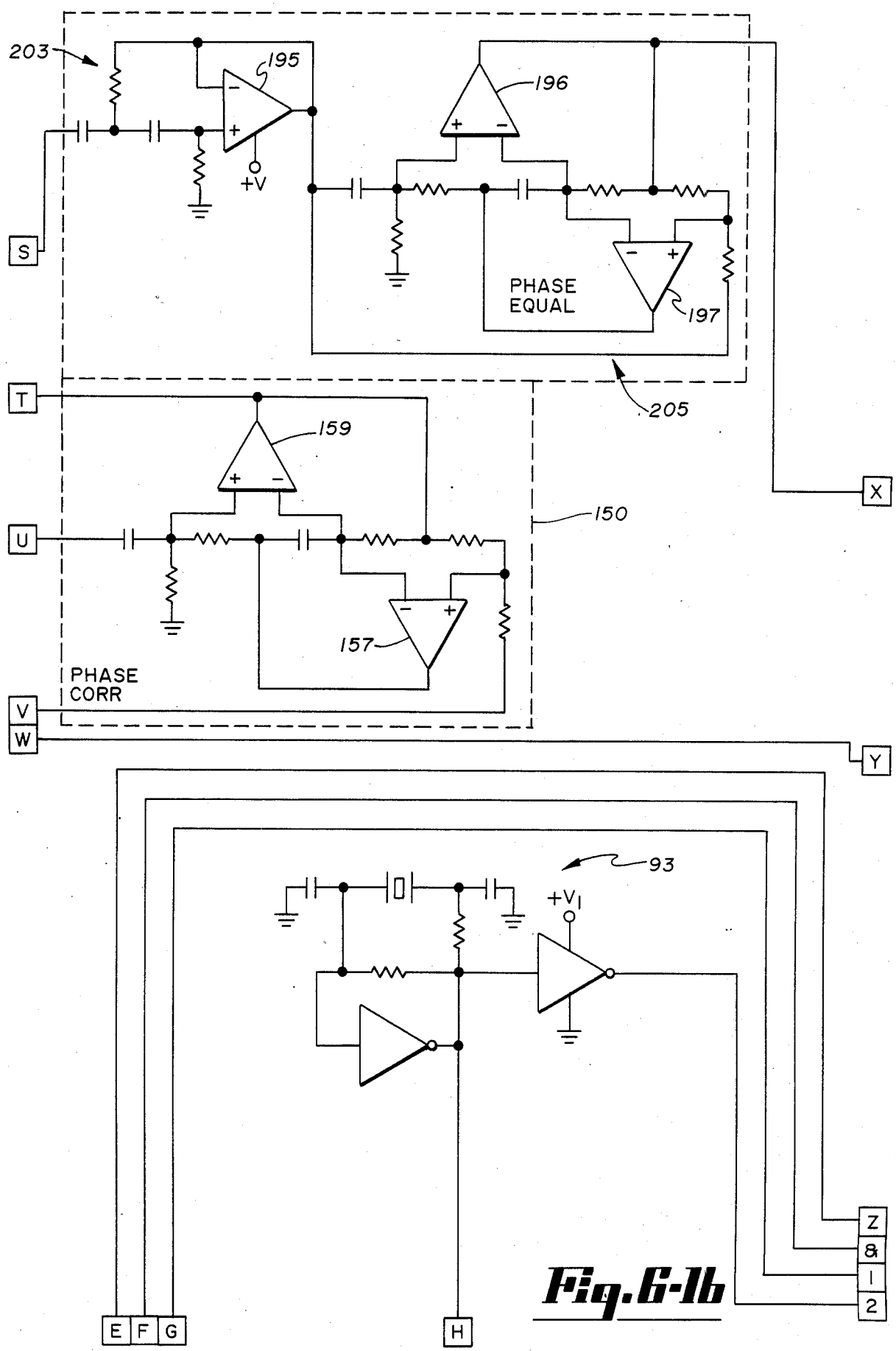
Figures 1D, 6:
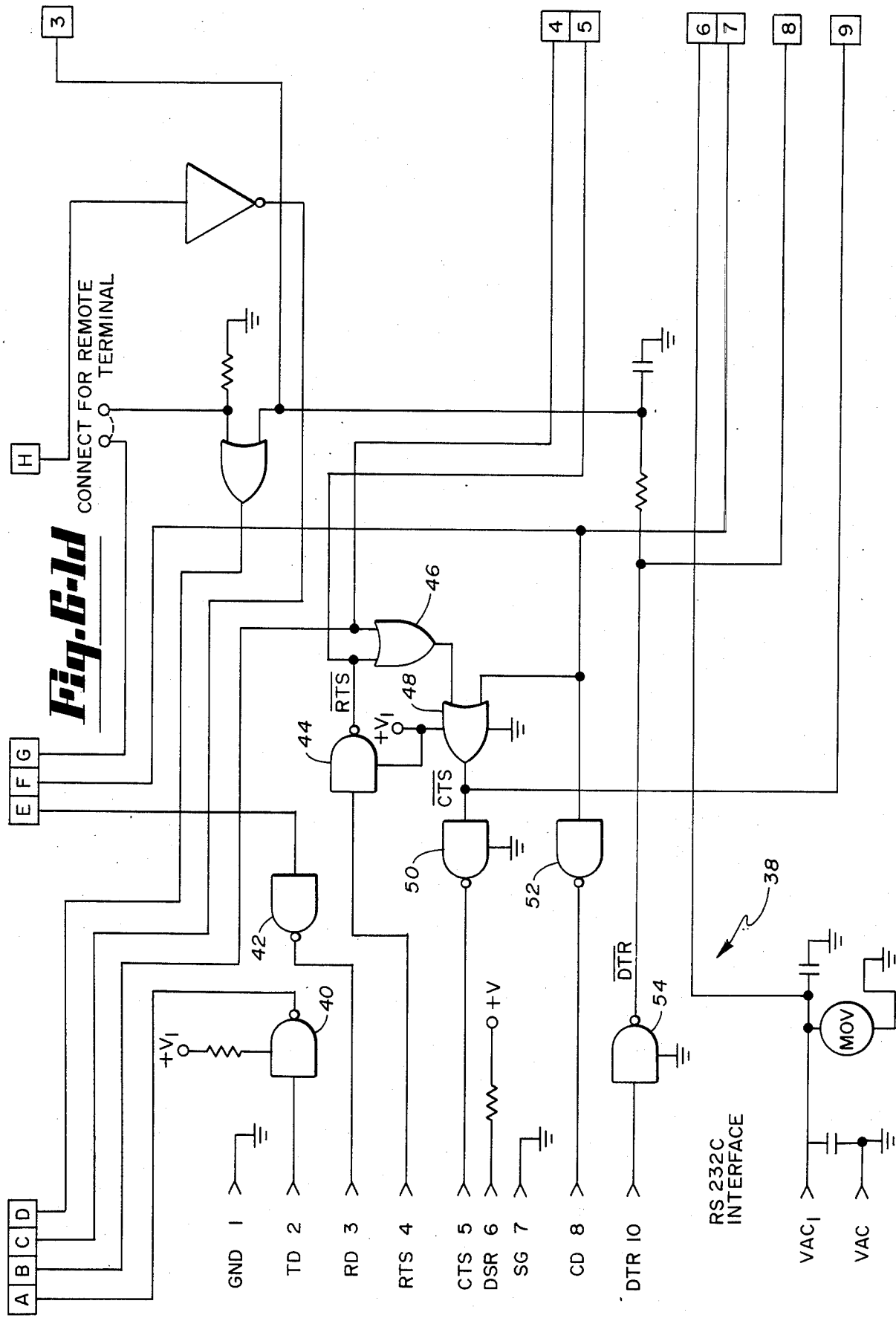
Figures 1E, 6:
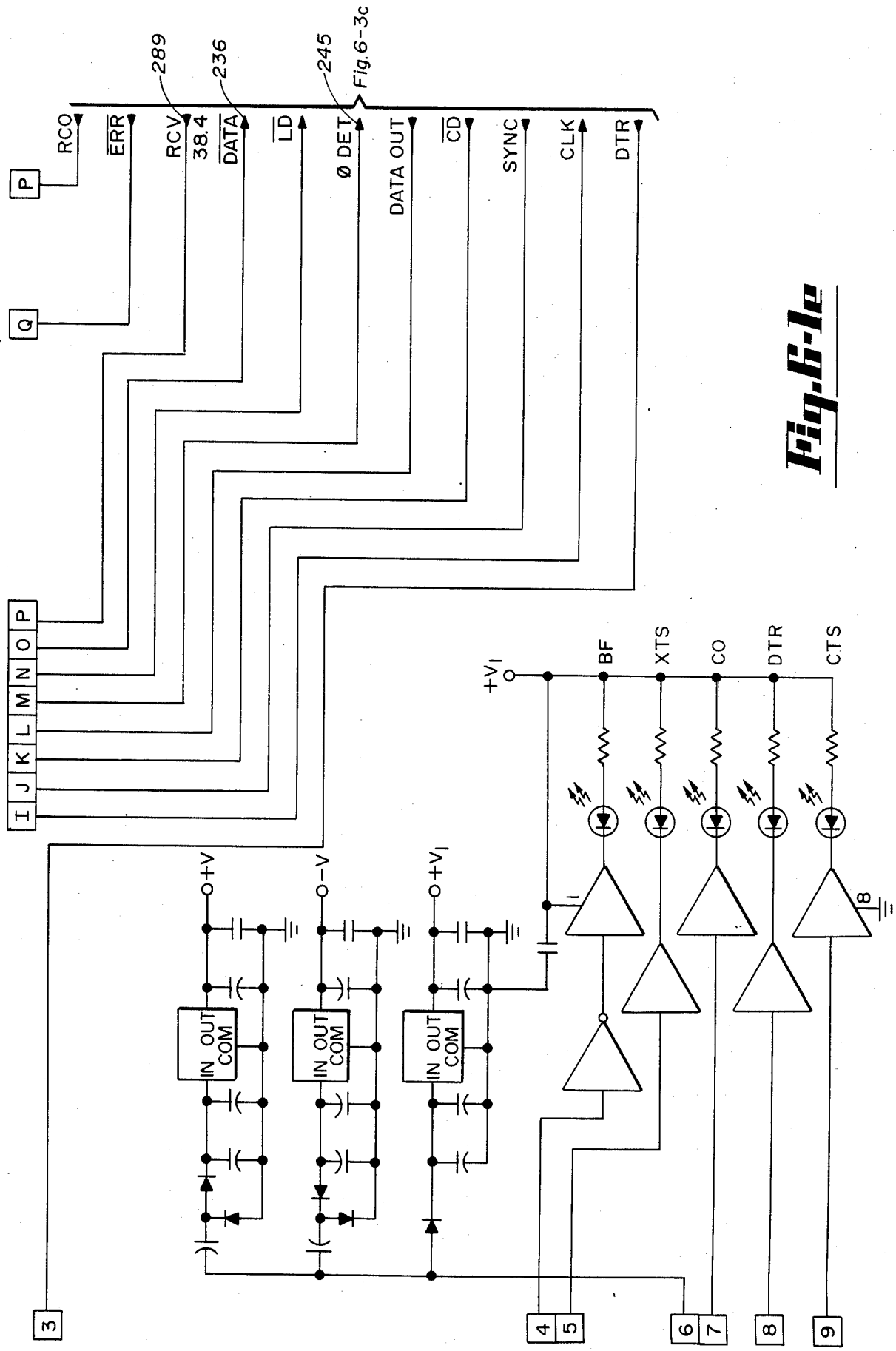
Figures 2A, 6:
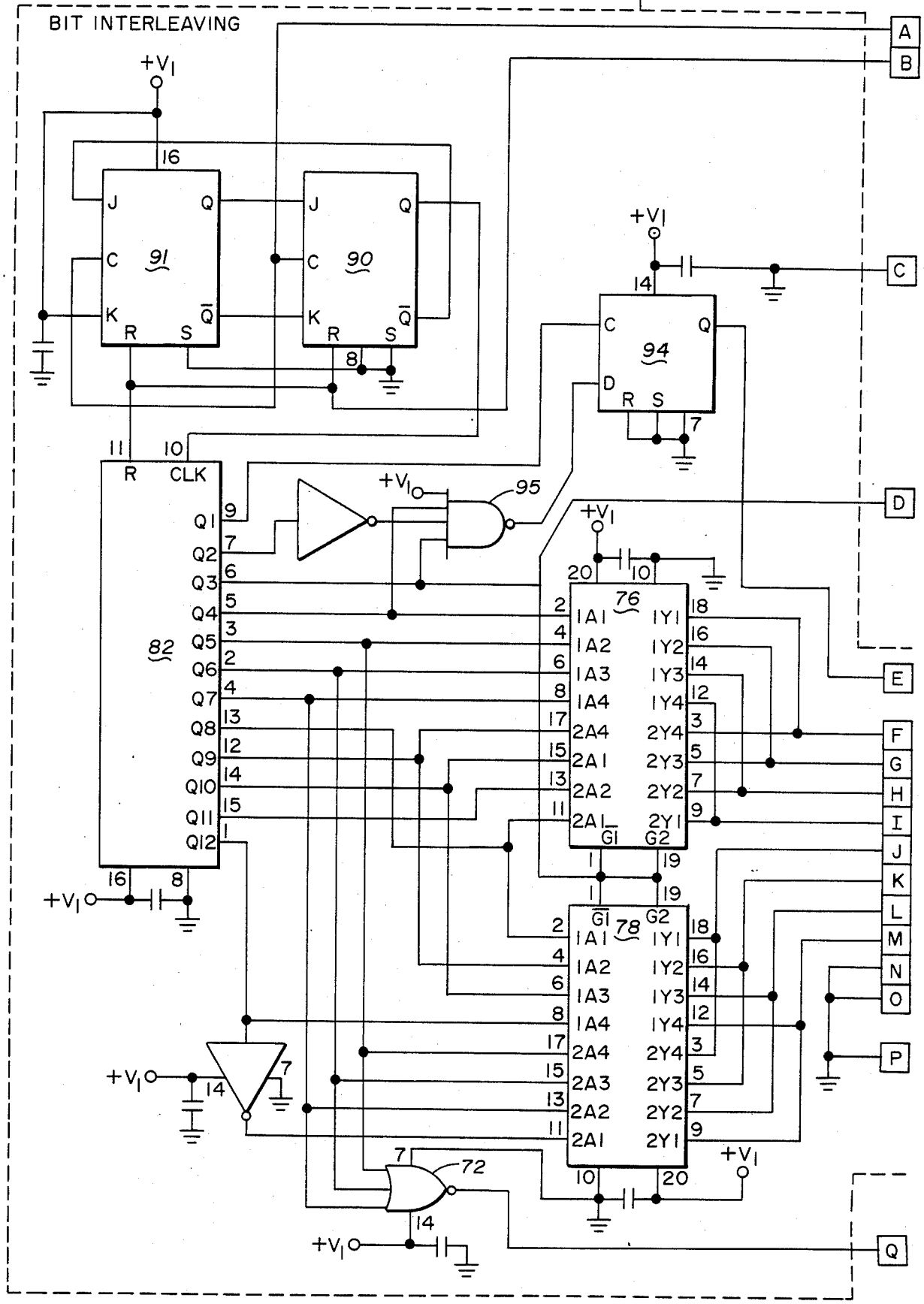
Figures 2B, 6:
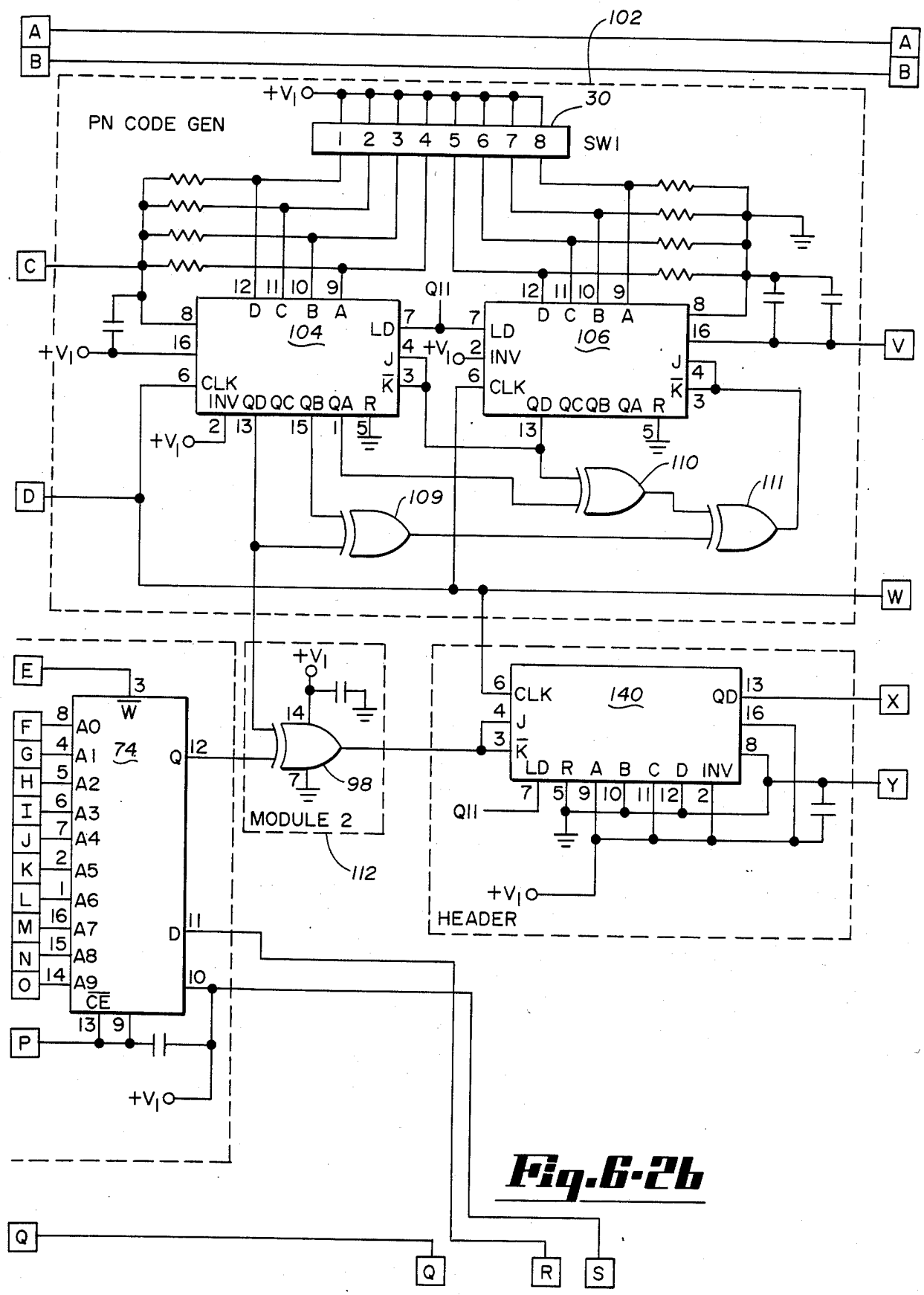
Figures 3A, 6:
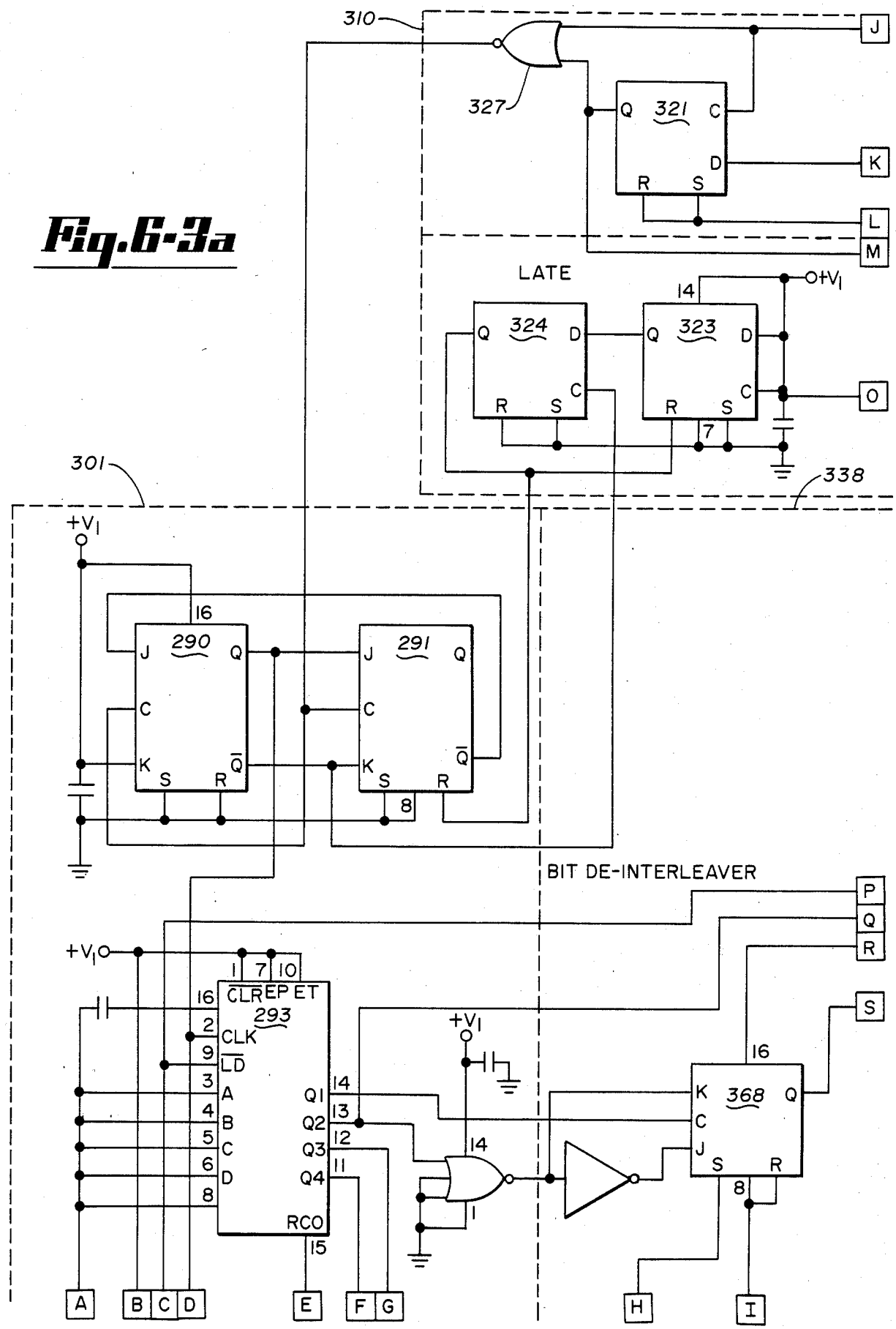
Figures 3B, 6:
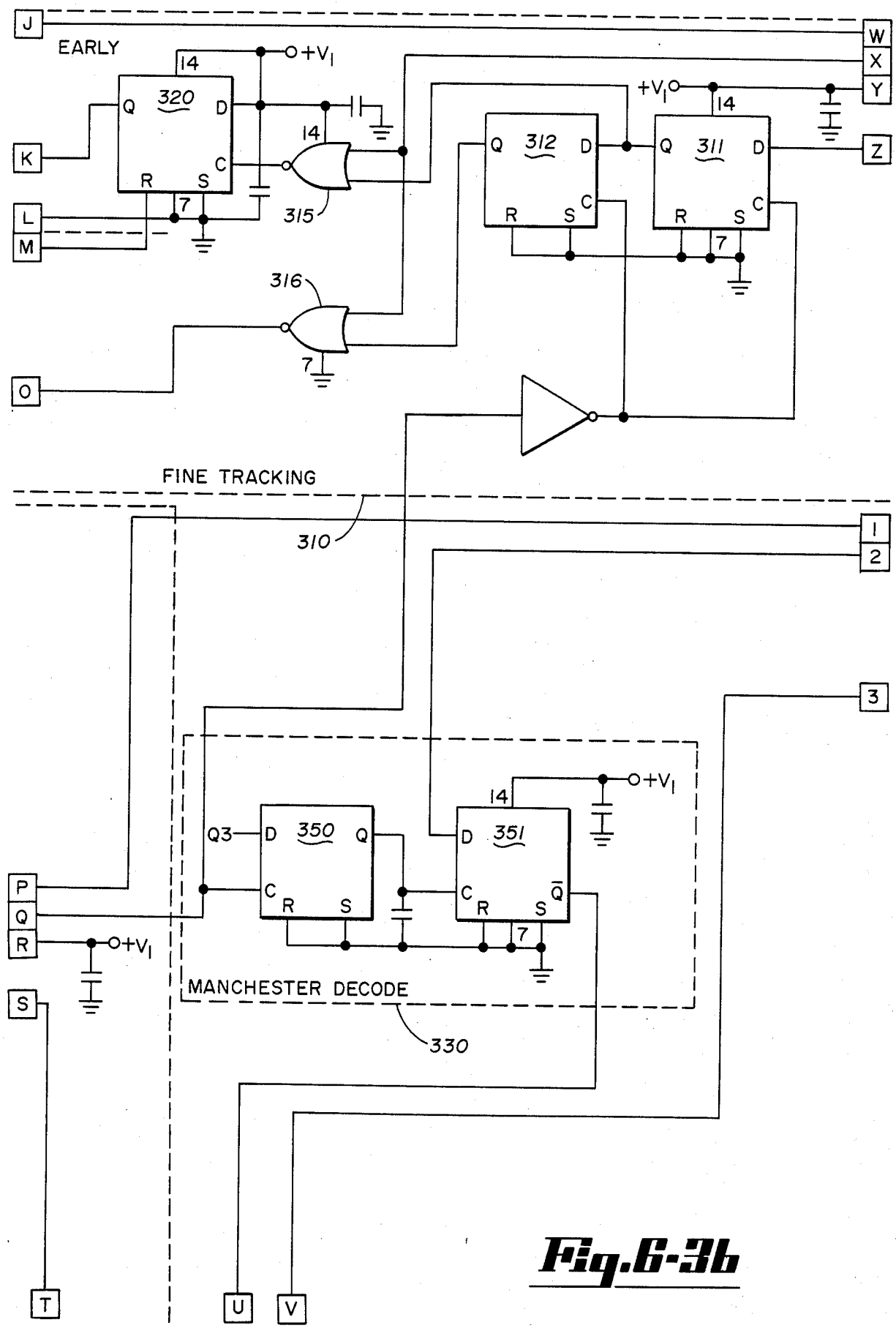
Figures 3C, 6:
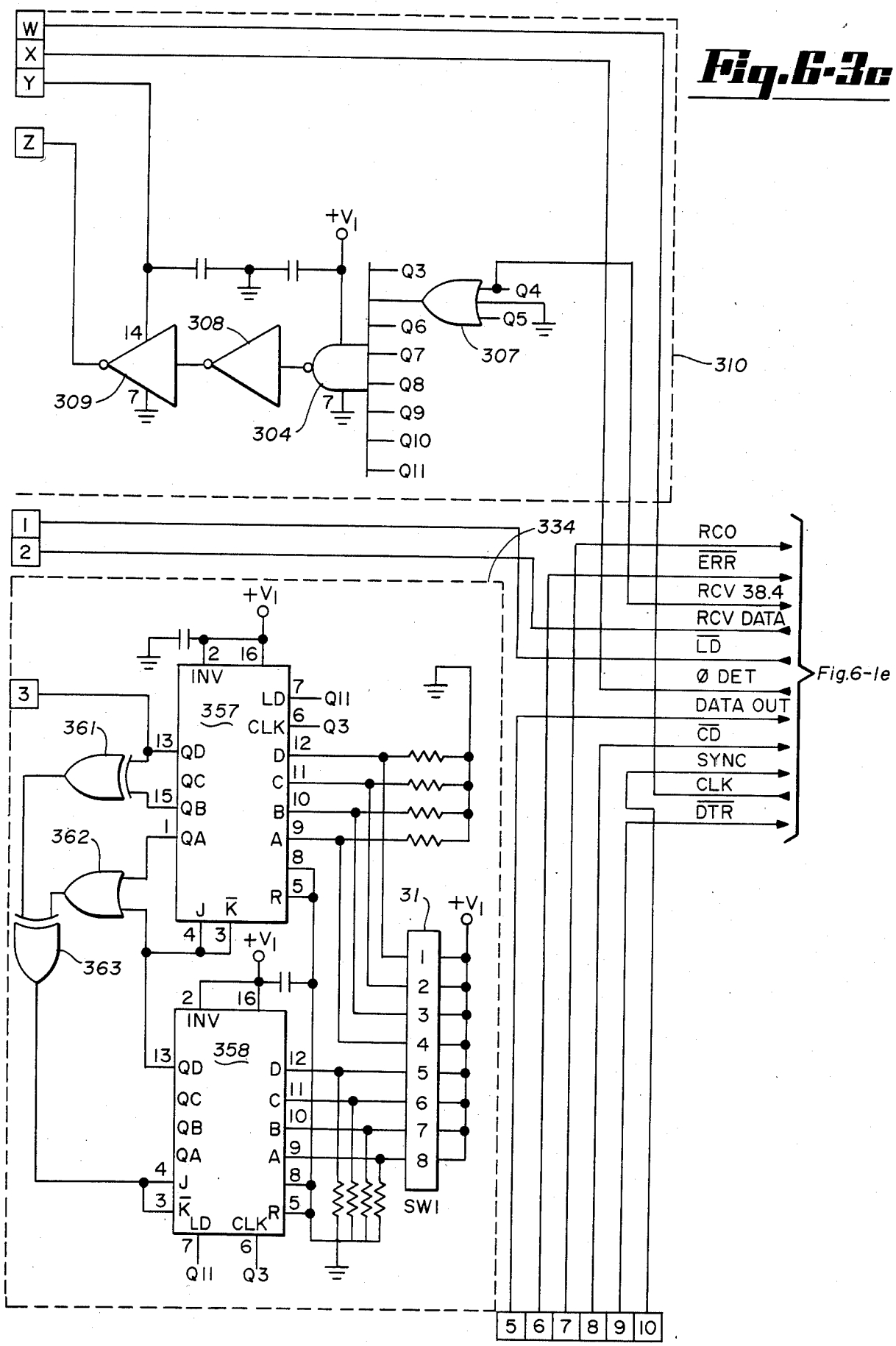
Figures 3D, 6:
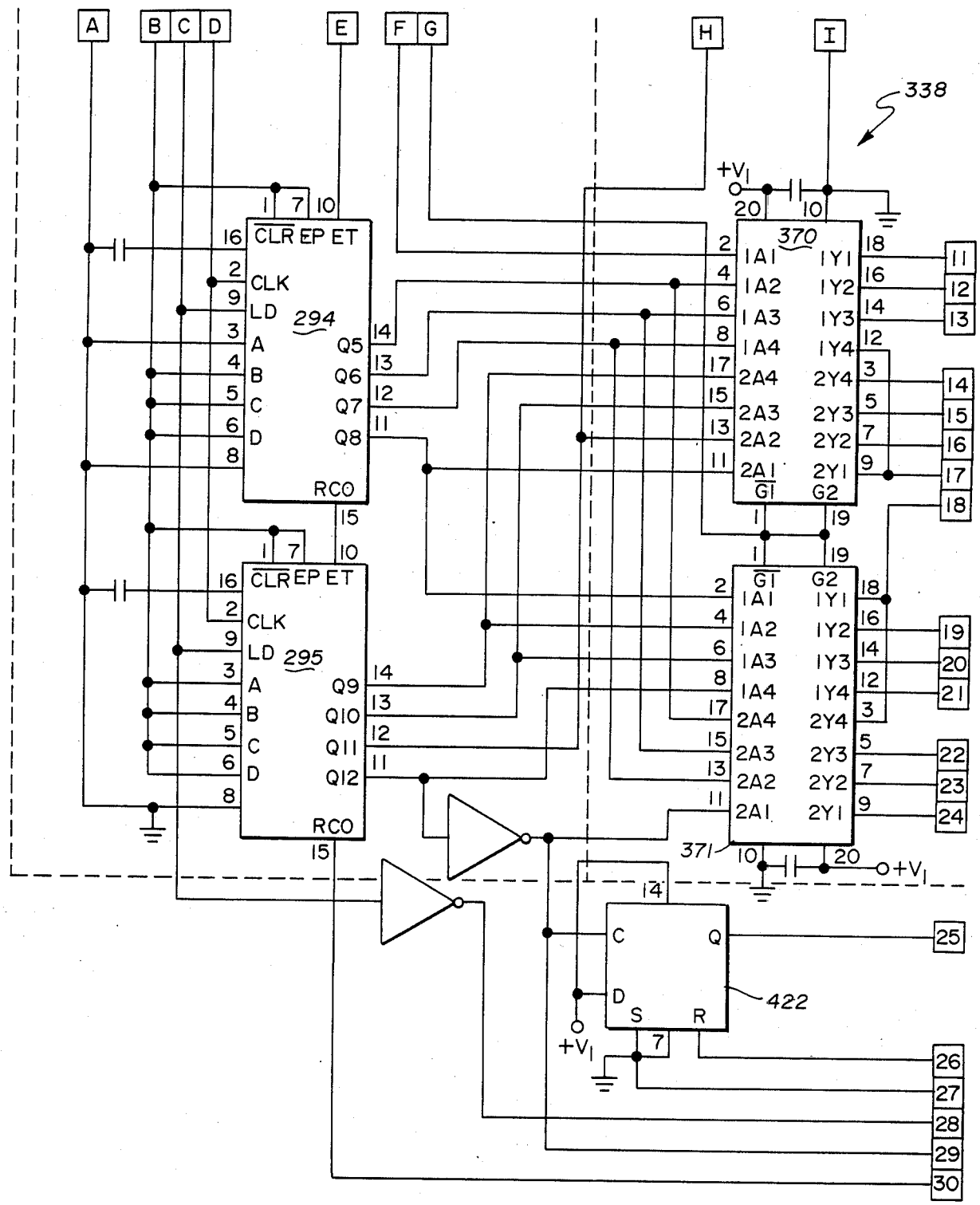
Figures 3E, 6:
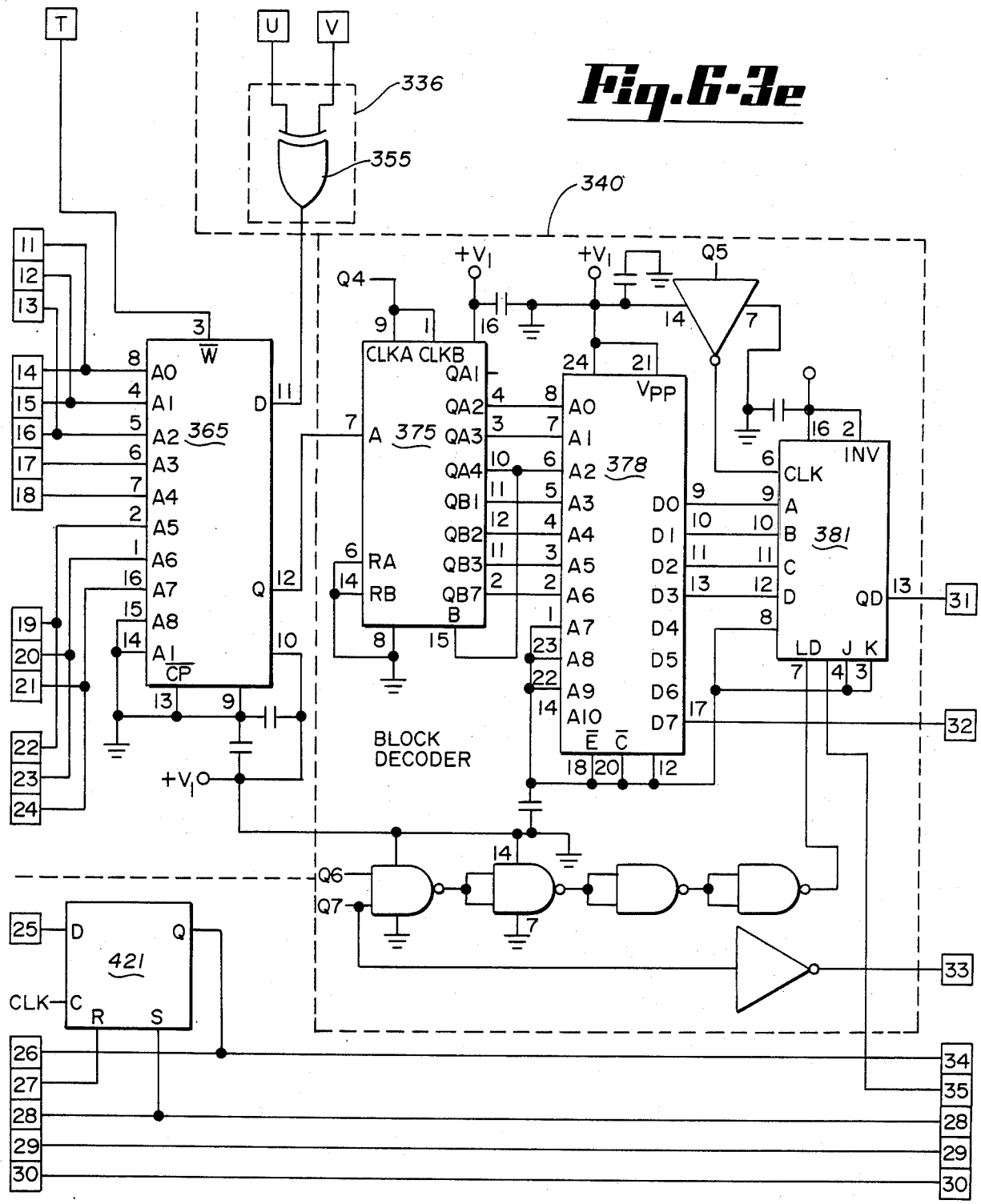
Figures 3F, 6:
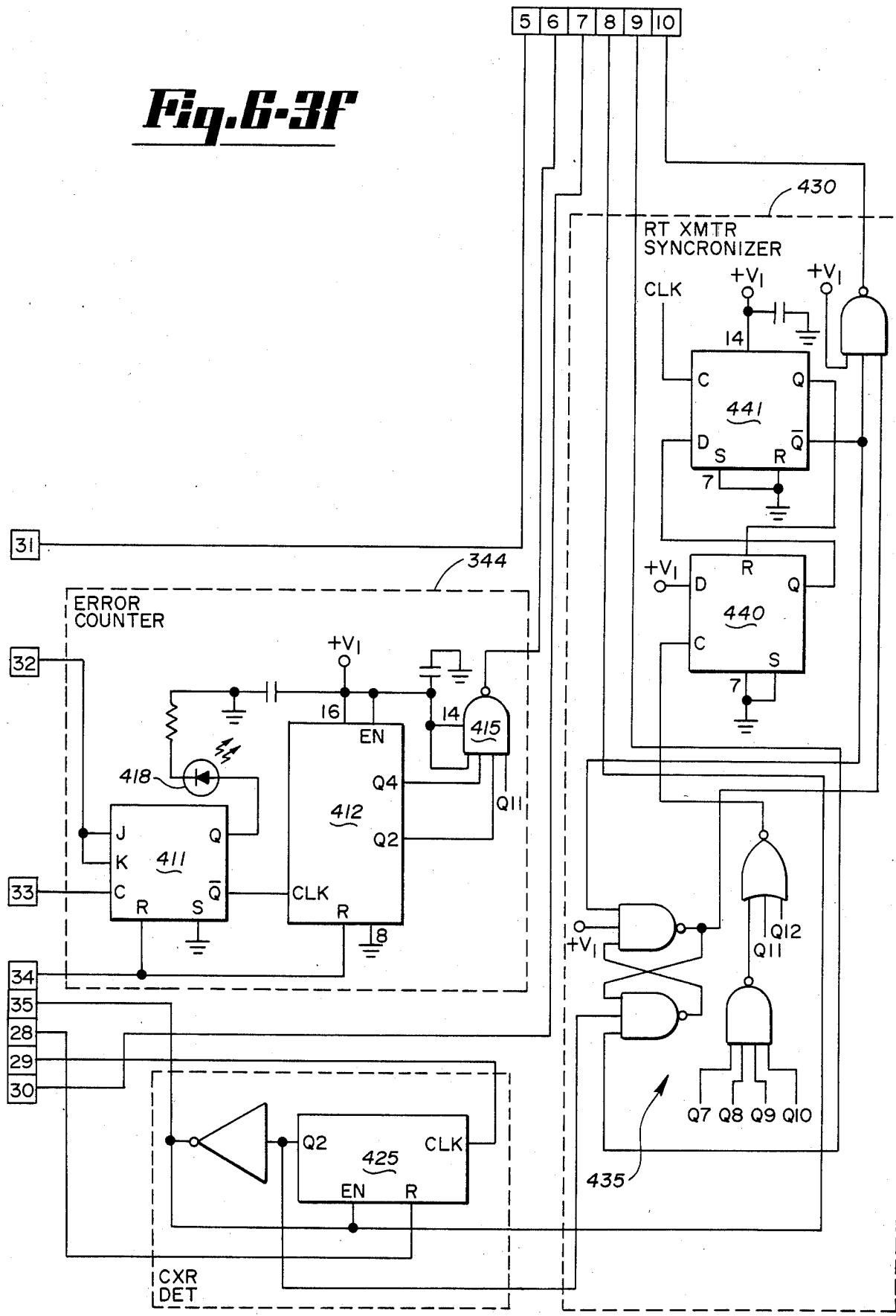

Each module 12 consists of three basic units; an input-output circuit shown in FIGS. 6-1a through 6-1e, transmitting logic shown in FIGS. 6-2a through 6-2d, and receiving logic shown in FIGS. 6-3a through 6-3f.

Figure 8:
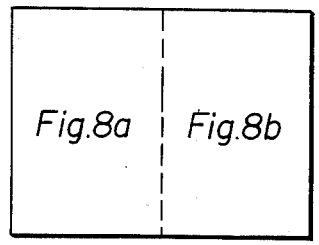
FIG. 8 is the layout for FIGS. 8a and 8b.

If asynchronous data is to be transmitted a UART 35 and data buffer shown in FIG. 8 is interposed between the input-output circuit and the transmitter logic.

As shown in FIG. 6-1d to be transmitted is connected to an RS232C interface 38 of conventional configuration. Logic gates 40, 42, 44, 46, 48, 50, 52 and 54, are utilized to sort out the request to send on terminal 4, the clear to send on terminal 5, carrier detection on terminal 8 and other handshaking requirements of the terminal.

When data is present on the RS232C, 38, transmit data port, port 2, it is connected through line receiver 40 to the transmitter logic circuit of FIG. 6-2a through 6-2d and is connected, for synchronous transmission, along line 21 to a block encoder 60 consisting of two shift registers, 62, 64, and two exclusive OR gates, 68, 70, which operate to serially generate seven bits for each four bits of data that are connected to the block encoder. For synchronous operation the buffer connections 24 are not used. For asynchronous transmission buffer connections 24, a UART 35 and buffer shown in FIG. 8 are used which will be discussed in more detail below in connection with FIG. 8. A NAND gate 72 shown in FIG. 6-2a connected to the counter 82 loads four bit slices of the sixty-four bits of data into the block encoder 60 where each four bit data word is converted into a seven bit code word. The conversion of data bits into seven bit code words is illustrated in FIG. 3.

The seven bits for each four bit data word are temporarily stored in a random access memory 74, manufacturer's designation 2102. The random access memory 74, two multiplexer chips, 76, 78, and a main program counter 82 constitute the main elements of the bit interleaver 85 which is timed off the main clock crystal. The program counter or sequence generator, 82, is connected to the multiplexers, 76, 78, so that addresses are supplied to the RAM, 74, in the proper format. A first sequence of addresses is provided to write the data into bit locations in serial order by column, as illustrated in FIG. 3. A second read sequence is provided to supply the correct addresses to read the data bits out serially by rows, as also illustrated in FIG. 3. It will be understood that the rows can be sequentially read out in any order.

The portion of the RAM, 74, that is used for block encoding is essentially organized in two data areas; one area for reading in data and a second area for reading out data. When data is being written into the data in area in serial order by column, (frame n) the previous sixty-four character block that was written in the previous frame (frame n−1) is read out of the second area by rows in a staggered order at a very high rate. The data in rate to the RAM, 74, is 38.4 kilohertz and the data out rate is 76.8 kilohertz.

Figure 2:
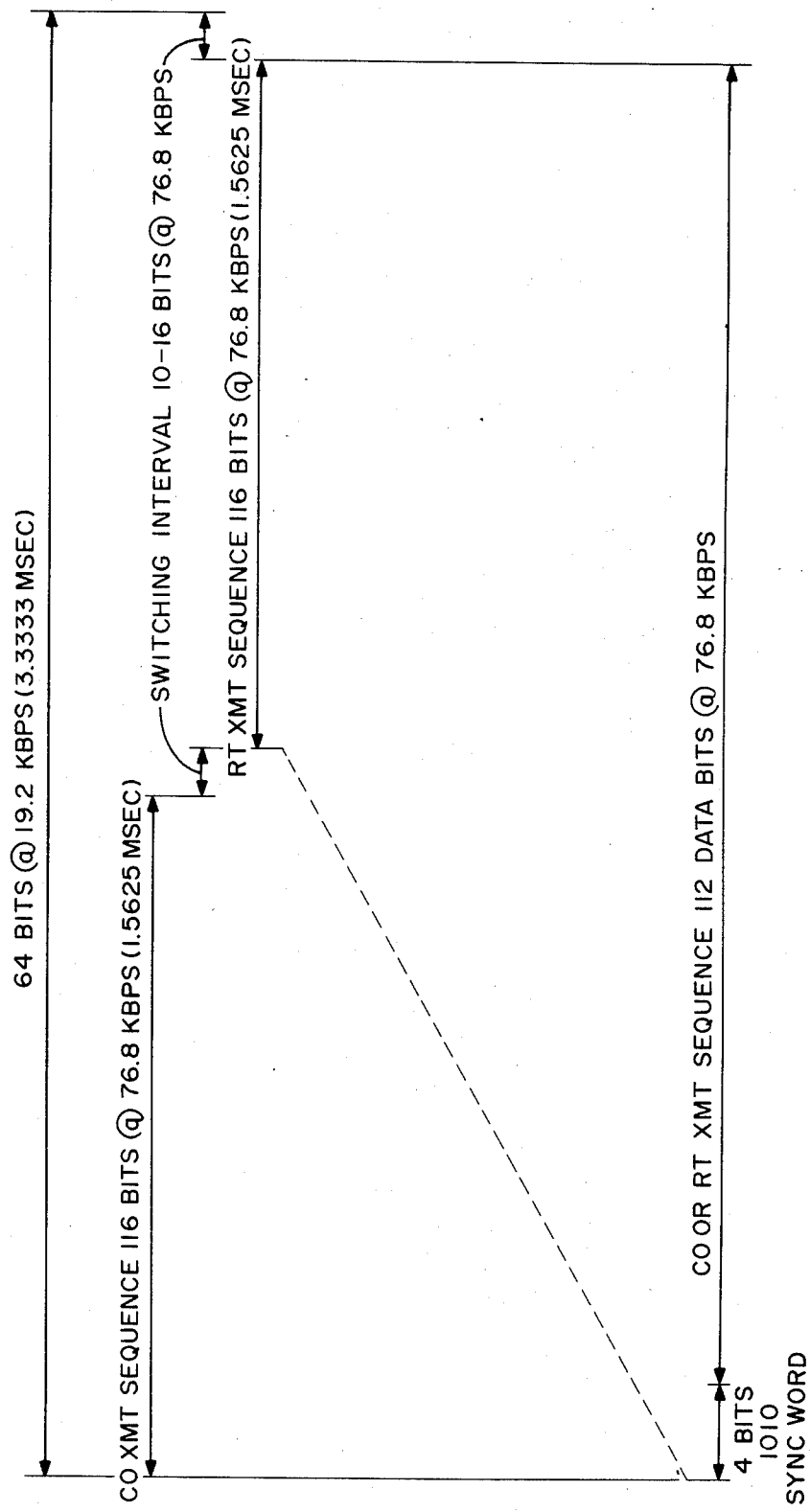
FIG. 2 is a system timing diagram showing how encoded bits are transmitted using time compression multiplexing to achieve the bidirectional 19.2 kilobit per second data rate.
Figure 3:
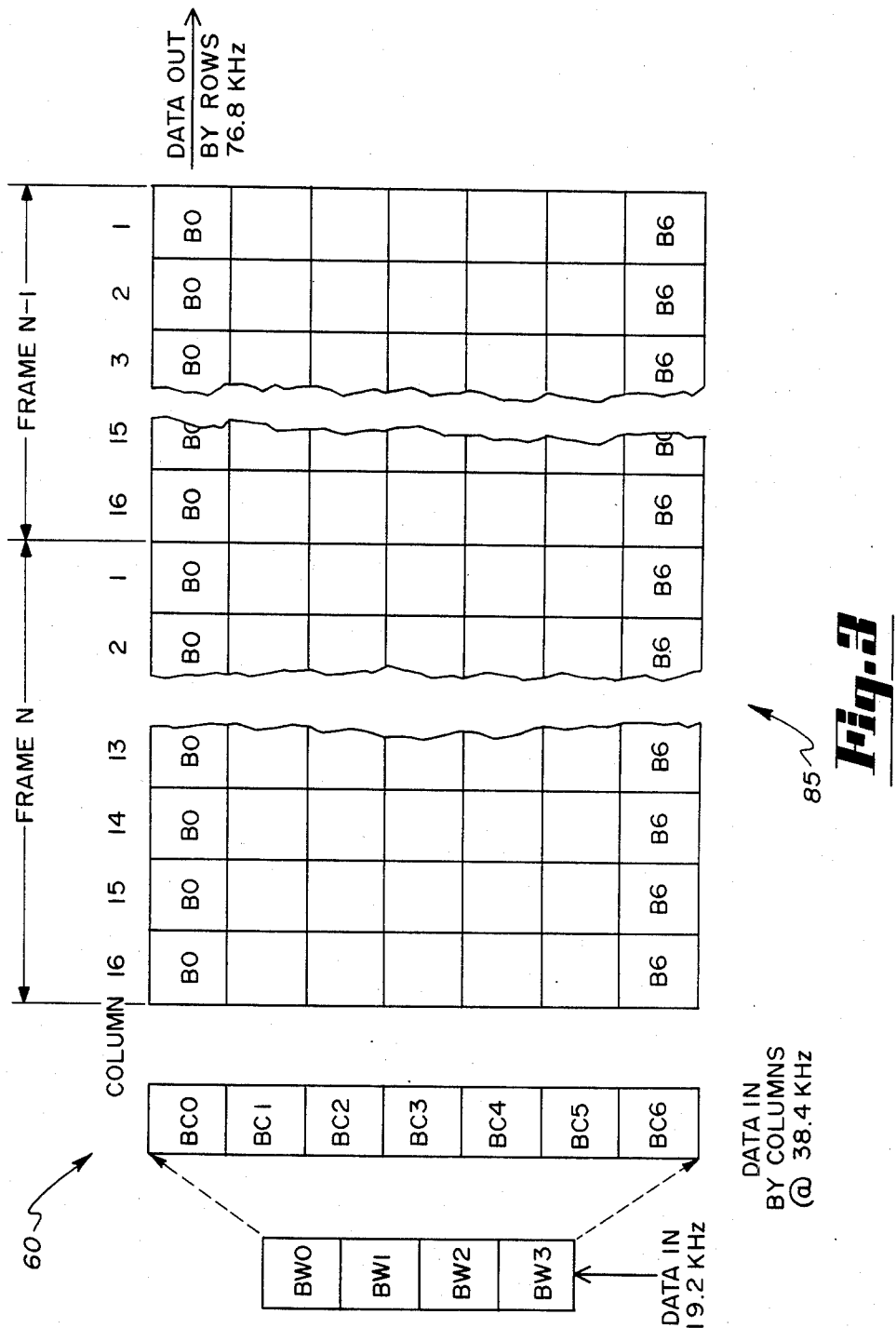
FIG. 3 is a diagram of the encoding process which includes the block encoder which produces a seven bit code word corresponding to the four bit data word and the bit interleaver which results in a bit stream having all the first code bits sequentially transmitted followed by the second code bits, etc. It should be understood that this diagram is equally applicable to the received data which is de-interleaved and decoded back to the four bit data word which was transmitted.

Illustrated in FIG. 3 is the encoding process. FIG. 3 shows the four bit encoding, the preferred embodiment, wherein successive four bit portions of the sixty-four bits of data to be transmitted are taken in, starting with the beginning of each time slot of the timing diagram of FIG. 2. Each four bits of data are transformed into a seven bit code word for transmission. In other words, each seven bit code word transmitted contains four bits of data and three bits of parity organized such that an error in any one data bit is always three bits different than any other valid data word in the sequence. Consequently, each valid data word is three bits different than any other valid data word so an error in any one transmitted bit of the seven bit word can be corrected back to the valid data word. This process is known as block coding using a "4-7-1 correction code".

In this manner, the sixty-four bits to be transmitted are all coded into sixteen different seven bit code words.

The code words are then organized in the RAM, 74, so that each of the corresponding bits of every code word is transmitted. A logical progression from the diagram shown in FIG. 3 is to transmit bit 0 of every code word, then bit 1 of every code word, then bit 2 of every code word, although in practice the bits can be transmitted in any order. The purpose of transmitting in this format is so that every code word is spread very widely across the entire transmitted burst. The reason this is done is because basic error generation on a telephone line is a transient. When a transient occurs it affects the simultaneous portion of the bit stream which occurs at the time of the transient. If each seven bit word were transmitted as a unit a transient might wipe out the entire word. This data could not be recovered.

Using the transmission scheme proposed one bit of a number of seven bit code words might be destroyed by a transient. However, when converted back into the four bit data words, the error correction circuitry corrects any errors in the transmission caused by the transient. While discrete circuitry is disclosed as the preferred embodiment of the invention, it will be obvious to those skilled in the art that a microprocessor might also be advantageously used. An alternative embodiment (not shown) can be used with microprocessor controlled circuitry. Using the same encoding process, eight bit bytes would constitute the data in and the data can be encoded in two four bit slices or nibbles of each eight bit byte and interleaved for transmission in the same manner.

Referring back to FIG. 6-2, the bit interleaver, 85, also comprises two flip-flops, 90, 91, manufacturer's designation 4027, which constitute a divide by three circuit to prescale the 1.8432 megahertz crystal 93 frequency to 614.4 kilohertz to drive the main program counter 82. A third flip-flop, 94, manufacturer's designation 4013, and NAND gate 95 operate as a decode circuit for the write signal so that when the write signal occurs the data is stable in the RAM, 74.

Consequently, the data is written into the RAM, 74, at a slow rate, but written out at the faster 76.8 kilohertz rate. The output of the RAM, 74, is connected directly to an exclusive OR gate, 98, to provide one input thereto. The other input is the pseudo random code generator, 102. The resulting output is the modulo-2 whitened output which is to be transmitted on the telephone line.

The pseudo random code generator, 102, is of conventional design consisting of an eight position dip switch, 30, two serially connected four stage shift registers, 104, 106, and three exclusive OR gates 109, 110, 111. Any suitable pseudo random code generator can be used. However, as disclosed, the pseudo randomly generated whitening code also gives each user a degree of privacy in that the user can select any one of two hundred fifty-five formats —sequences of the pseudo random code selectable with the dip switch, 30, —which will be unique to the user.

When the data stream is connected in a modulo-2 encoder 112 with the pseudo random code generator output to the exclusive OR gate, 98, the resultant output is the modulo-2 add. As is known to those skilled in the art, the pseudo random code will be identical to that used in the receiver and the resulting bit stream will be synchronized with a header to be discussed below.

The use of the pseudo random code word with the data stream greatly reduces the possibility of cross-talk. Consequently, out of a six hundred pair cable, two hundred fifty-five users or modems 12 can be used in the same cable bundle without cross-talk. This should be distinguished from conventional FSK data transmission where two hundred modems or more on the same bundle are putting out the same signal. With a large data fill on a cable bundle, high frequency cross-talk between pairs becomes significant and can cause an inadvertent lock to someone elses modem.

A synchronization circuit 113 is provided consisting of a multiple input NAND gate, 115, and NOR gates, 117, 119, inverters, 122, 123, a flip-flop, 125, and a shift register, 128. All control of synchronization and timing for the burst transmissions is achieved from outputs Q3, Q8, Q9, Q10 and Q11 from the main counter, 82. Q8 through Q10 are connected to the multiple input NAND gate, 115, which is connected as the input to the shift register, 128, and Q3 which clocks the shift register, 128. The input signal from NAND gate, 115, is combined with the output of the shift register, 128, and connected through a NOR gate, 117, and inverter, 122, to the D input of the flip-flop, 125, which is also clocked by Q3. The flip-flop, 125, is reset upon the occurrence of the Q11 timing pulse from the main counter, 82, or a reset pulse through NOR gate, 119, and inverter, 123, to reset the flip-flop, 125. The not Q output is connected to the input-output board to control the transmit-receive switch, 130, and to enable a NOR gate, 133, in the Manchester encoder to permit the transmission of data.

Transmission of data is also initiated with the Q11 timing pulse from the main counter, 82, which is connected to the output shift register, 140. Pins 9 through 12 of the shift register, 140, are connected alternatively to plus five volts and ground to provide the "1010" synchronization header shown in FIG. 2. Thereafter the data bit stream is sequentially shifted through the shift register, 140, at the clock rate.

The output of the shift register, 140, on pin 13 is connected to the Manchester encoder, 135, to achieve biphase coding. The Manchester encoder, 135, consists of a flip-flop, 138, a NOR gate, 133, and two exclusive OR gates, 142, 143, which serve to double the data rate so that each single data bit is represented by essentially two elements per time slot wherein one of the elements is either a true or false element and the other element is the complement element. In other words, if a mark is to be represented a "1, 0" is sent; if a space is to be represented a "0, 1" is transmitted in the time slot. The data transmitted then is represented by the transition in the center of the time slot. If the transition is from high to low that represents a mark; but if the transmission is from low to high that represents a space or logic zero.

This enables more accurate decoding of the data. As will be explained below, high pass filters are used to filter off the voice signal. The filtering phases the source of data so that when data eye patterns are compared, the last element of the Manchester code is recoverable. This is particularly true at longer distances after equalization and slope correction which tends to close up the first eye of each data eye pattern. The data rate is sampled at the center of the second eye for the best performance which is the complement element. Therefore, if the sampled Manchester code bit or element is a zero the receiver determines that a true or logic level 1 was transmitted in the time slot. But if a logic level 1 is indicated, a zero was transmitted in the time slot. Consequently, the data as transmitted is at a 115.2 kilohertz rate.

The transmit enable signal is connected on the input-output board shown in FIGS. 6-1a through 6-1e, to enable a CMOS transmission gate, 145, to which the transmitted data stream is connected. The output of the gate, 145, is connected to three series connected analog filter circuits, 148, 150, 153, using operational amplifiers, 155, 157, 159, 161. As shown in FIG. 6-1a and 6-1b a first high pass filter section, 148, is utilized, followed by an all-pass phase correction network, 150, which corrects the phase response due to the high pass filters, 148, 153, and transformers. The output is connected to a second high pass filter, 153, and to one winding, 164, of the line coupling transformer, 165, the other winding, 168, of which is connected to the tip and ring terminals, 171, 172, of the telephone system.

Also shown in FIG. 6-1a is the voice path, 180, which is passive. The voice signal which is connected to the tip and ring terminals, 171, 172, is blocked from the high frequency data circuits by a blocking capacitor, 183, is passed through a low pass filter section, 180, to a female jack tip and ring connection, 186. The high frequency data signals are kept out of the voice path by the isolation from the low pass filter, 180.

This circuitry demonstrates another advantage of the invention in that if for any reason the module becomes disconnected, the telephone will continue to be useable, transmitting and receiving only analog voice. In other suggested systems where the voice is converted to digital transmission with a codec, disconnection of the module causes the entire communication system to be disabled, including use of the telephone for normal voice conversations.

As shown in FIG. 2 the foregoing transmit sequence occurs in both directions during each frame (64 bit data interval). The data frequencies illustrated in FIG. 3 show how the data is converted from the four bit data word at 19.2 Kbps to a time compressed transmission in both directions at 76.8 Kbps.

At each end of the line identical circuitry is used for transmitting and receiving. Data, when transmitted, appears across the tip and ring connectors, 171, 172, of the telephone line. The data is blocked from going through the voice path by the low pass filter, 180, which provides a very high impedance at high frequencies. The data is coupled across the line coupling transformer, 165, to the receiving circuit. Two zener diodes, 190, 191, are provided for transient protection. From the coupling transformer, 165, a receiver filter chain is provided using four operational amplifiers, 194–197, which are configured similarly to the transmitting filters, 148, 150, 153, discussed above. As shown in FIG. 6-1a and 6-1b two high pass filter sections, 201, 203, are provided followed by an all-pass phase correction filter section, 205. Following the filter sections, 201, 203, 205, a jumper field, 209, is provided. For short range transmission and reception, up to about six kilofeet, the output of the phase correction filter, 205, is connected directly into the received data logic circuits. For longer range loops, from six to twelve kilofeet and farther, amplitude equalization and slope correction filters, 212, are utilized consisting of two operational amplifiers, 213, 214.

From the jumper field 209 the data takes three basic paths: through a slicer circuit, 220, to detect the data; through a second logic circuit, 223, for phase detection of the data, and a third path through a coarse acquisition circuit, 225, to assure that valid data has been identified.

Phase detection is achieved through the NAND gate, 228, limiter circuit, 220, which operates to perform a zero crossing slice on the data. The output is connected to a second NAND gate, 234, connected to an output port, 236, which provides the data out. The data stream is also connected through an exclusive OR gate, 240, and NAND gate, 242, for purposes of phase detection which is also connected to an output port, 245. The third circuit, 225, function of coarse acquisition is used for receiver synchronization. In essence, the circuitry serves to peak detect the signal and filter it so the envelope of the burst can be identified and locked to.

The data stream is amplified with two operational amplifiers, 248, 249, two NAND gates, 250, 251, and associated components to increase the signal level to CMOS logic levels. A control signal from the receiver logic is applied to set a flip-flop, 255, to be discussed below, through two NAND gates, 260, 261, and an exclusive OR gate, 263 so that the course acquisition circuit does not lock to a transmitter burst. An excessive error signal from the receive circuitry also resets the flip-flop, 255. A counter, 265, with associated logic elements, 267–269, is provided as a test circuit to assure that a burst locked onto is valid. A short RC delay is provided by a resistor, 272, and capacitor, 273, to be sure that a noise pulse does not trigger the counter, 265. The counter, 265, is configured to count and receive four valid data bits within a predetermined amount of time determined by a second resistor-capacitor delay circuit, 275.

If at least four data bursts within a predetermined time do not occur, the counter, 265, is reset and the process can be repeated again.

The circuit, 225, is also used to determine when the remote transmitter stops transmitting. Therefore, if a pulse fails to appear at the input at the proper time, a similar pulse through exclusive OR gate, 278, will reset the main latch, 255. Excessive errors appearing on an input lead from the receiver circuit through NAND gate, 261, and exclusive OR gate, 263, will also kill the receiver and start the synchronizing acquisition cycle again.

Consequently, the coarse acquisition circuit, 225, is activated by the leading transition in the header. It starts the acquisition sequence by setting the flip-flop, 255, consisting of two NAND gates, 281, 282, configured as a Schmitt trigger. Missing received data bursts or excessive errors identified in the received data will reset the flip-flop, 255, which starts the synchronizing acquisition cycle over again.

The phase detector circuit, 223, is used to assure clock synchronization between the transmitter and receiver. A resistor, 285, and capacitor, 286, provide a delay which functions as a small guard band. The receiver clock at 38.4 kilohertz is connected from an input terminal, 289, to one input of the exclusive OR gate, 240. The header frequency is connected as the second input to the exclusive OR gate, 240. If the signal is correctly locked in both signals should be in phase at the second transistion of the header signal.

Referring now to FIGS. 6-3a through 6-3f, the balance of the receiver logic and its operation can be understood. The output of the flip-flop, 255, is connected to initialize a three stage master sequence counter, 301, for the receiver, consisting of two flip-flops 290, 291, and three series connected counters, 293-295, and reset other circuit elements. The counter, 301, sequence or establishes the proper time to pre-evaluate and decode the data. The counter sequence and receiver clock are connected to a multiple input NAND gate, 304, and other logic elements, 307-309, to establish a fine tracking synchronization circuit, 310, utilizing two flip-flops, 311, 312, the outputs of which are connected to two NOR gates, 315, 316.

The phase detection output from the phase detection circuit, 223, also is used and connected to enable the two NOR gates, 315, 316, one, 315, for an early window and the second, 316, for a late window. Depending on the phase difference between the incoming data and the receiver clock, a pulse will be generated out of the phase detector circuit, 223, determining whether the incoming signal is early or late relative to the receiver clock. A set of two flip-flops each, 320, 321, and 323, 324, are used as synchronizer circuits for both the early window and late window. The fine tracking synchronization circuit, 310, operates as a one and only one synchronizer circuit. When the early window tracking synchronizer circuit, 320, 321, is activated by the phase detector, it essentially toggles a NOR gate, 327, off for exactly one clock period. This essentially swallows a clock pulse into the counter, 301, and slows the counter, 301, by one count.

If the phase detector pulse activates the late gate, 323, 324, it trips one, 291, of the set of flip-flops, 290, 291, which operate as the divide by three circuit for the clock rate to the counters, 293-295, and essentially converts it to a divide by two circuit to speed up operation of the receiver.

The fine tracking circuit, 310, is required since the transmitter and receiver are running off of different crystals. With different crystals the clocks may not always be in phase and the fine tracking circuit, 310, will assure proper decoding by keeping the counter in step by kicking it back or kicking it ahead by one clock pulse or by approximately five hundred nanoseconds.

The decoding circuitry is substantially identical to the encoding circuitry discussed above and includes Manchester decoder, 330, a pseudo random code generator, 334, a modulo-2 decoder, 336, which removes the pseudo random spread spectrum coding from the data, a bit de-interleaver, 338, and a block decoder, 340, which performs the forward error correction. As will be explained in more detail below, an error counter, 344, is utilized since a high occurrence of error suggests that the receiver is not properly synchronized. The error counter output, therefore, resynchronizes the receiver to incoming data.

The received data from the bit slicer circuit, 220, is connected to a Manchester decoder, 330, consisting of two flip-flops, 350, 351. The center of the last element of the biphase coding is sampled and the output is taken from the not-Q output of the second flip-flop to invert the output. This output is connected to one input of an exclusive OR gate, 355, which performs the modulo-2 decoding. The other input to the exclusive OR gate, 355, is a pseudo random code generator, 334, which is configured to output the same code as that in the pseudo random code generator, 102, of the transmitter. A dip switch, 31, is provided for this purpose which is connected to two shift registers, 357, 358, and a series of exclusive OR gates, 361-363, in a manner similar to the pseudo random code generator, 102, of the transmitter. The output of the modulo-2 decoder, 336, is connected to the D input of a random access memory (RAM) chip, 365, which is used for de-interleaving the bits of the transmitted code word.

The bit de-interleaver, 338, is of the same design as the bit interleaver, 85, of the transmitter. The receiver counter, 301, is preferably a series of three counters, 293-295, manufacturer's designation 74C161. This permits loading of a preset count into the counter, 301, so that actual data, not the header, is decoded. The output of the counter, 301, is used, as explained above, to coordinate the sequence of the receiver and further to initially store the data in rows and decode the data out of the RAM memory, 365, in columns. As with the bit interleaver, 85, a flip-flop, 368, is provided so that data is stabilized at the time of writing it into the RAM, 365. Two multiplexers, 370, 371, are used to write the data into the RAM and to read it out.

To block decode the data the seven bit code words are obtained from the Q output of the RAM, 365, and connected to a serial input-parallel output shift register, 375. The seven bit code word is converted in a look-up table in a ROM, 378, and the correct (or corrected) four bit output data word is connected to a parallel input-serial output shift register, 381, the output of which on pin 13 provides the data output signal which is connected to the RS232C interface to be printed on the terminal display.

FIG. 7 shows an alternative embodiment for the block decoder, 340, which is suitable for use with LSI circuitry. The gate array, 390, of FIG. 7 performs forward error conversion converting the seven bit code word to four bits and would replace the shift register, 375, and ROM, 378, of FIG. 6-3e.

With both versions of the error correcting using the block decoder the error rate is monitored.

Referring again to FIG. 6-3e and 6-3f the error rate output from the ROM, 378, is on output D7, pin 17, which is connected to an error counter consisting of a flip-flop, 411, and a binary counter, 412. If the error rate exceeds twenty errors in two frames, determined on outputs Q2 and Q4 of the counter, 412, connected to a NAND gate, 415, an error signal is generated which resets the acquisition circuit. An LED indicator, 418, is also connected from the Q output of the flip-flop, 411, which will flash if a noisy circuit or a high error rate is detected.

Two additional flip-flops, 421, 422, are used with the error correction circuit, 344, which reset the error counter, 411, 412, every two frames. A carrier detection counter, 425 is also provided which monitors the first two frames of data before it emits a signal that the carrier has been detected to the RS232C terminal interface.

As also shown in FIG. 6-3f a transmitter synchronizer circuit, 430, is shown which is used only at the remote terminal location. The circuit, 430, is a slave circuit which waits until it receives a valid received data signal and then initiates the remote transmitter operation. At the central office end of the system the transmitter is free running. The inputs to the gate array, 435, of the transmitter synchronizer, 430, are the timing signals from the sequence counter, 301, and the carrier detect signal, indicating two frames of error free data input. The output is used to clock a series of two flip-flops, 440, 441, connected to a NAND gate which sends a synchronizing signal to the transmitter circuit to reset it for operation.

Shown in FIG. 8 is additional circuitry which is required when asynchronous data communication is used. The asynchronous data from the terminal through the RS232C interface, 38, is not connected directly to the block coder 60 as in the case of synchronous transmission of data. Instead, the input and output ports 24 shown in FIG. 6-2d are utilized to pass the data through a UART 35 and a first in-first out data buffer, 451, to stabilize the data rate prior to it being connected to the shift register 62 of the block encoder 60 at input pins 3 and 4.

A conventional terminal has its own clock which does not always correspond to the clock frequency in the modem. Consequently, a separate baud rate generator, 453, shown in FIG. 6-2d consisting of a dip switch, 454, and an eight channel analog multiplexer-demultiplexer, 456, which is controlled by the primary sequence counter, 85, of the transmitter is used along with the signal from the modem clock, each connected to the two stage buffer, 451, to stabilize the data rate.

The data from the terminal is connected to pin 20 of a conventional UART 35 which arranges the data in the standard UART asynchronous format and passes it through the first in-first out buffer, 451, consisting of two stages, 462, 463. The output of the buffer, 451, is connected back to the transmit side of the UART and from the UART output, the data is connected through gates, 470, to the block encoder 60. This assures that the transmitted data out of the UART 35 is synchronized with the internal modem clock.

Synchronization of the data with the modem clock is assured by connecting the modem clock to a series of three flip-flops, 480, 481, 483, which are interconnected as a data synchronizing circuit, 484, with the modem clock and the UART to assure that the data out of the first in-first out buffer, 451, is at the modem clock rate. Also connected to the buffer memory, 451, is buffer full detector circuit, 485, two four stage binary counters, 486, 487, and a flip-flop, 489, which monitor the data in the buffer, 451, and if the buffer, 451, becomes full generates a signal from the Q output of the flip-flop, 489, indicating the buffer, 452, is full which is connected through the RS232C interface, 38, to the terminal to prevent it from transmitting additional data.

A break signal detector, 494, is also shown in FIG. 8 which consists of a binary counter, 495, and a series of logic gates. A "break" signal is a space two hundred fifty milliseconds long which cannot be transmitted through the UART, 35. Consequently, the break signal detector, 494, is utilized to detect any space element longer than sixteen data bits and switch it through the logic gates to the transmitter.

On units where the asynchronous circuitry of FIG. 8 is installed, closing dip switch SW1, number 6, will allow synchronous operation.

The foregoing specification sets forth certain preferred embodiments and modifications of our invention and some of the ways in which the invention may be put into practice, including the best mode presently contemplated by the inventors for carrying out their invention. Modification of the described embodiment, as well as alternative embodiments and devices for carrying out the invention will also be apparent to those skilled in the art. All such variations and modifications are intended to be within the spirit and scope of the following claims.

We claim:

1. In a communication system for communication of digital data information on the same communications medium as analog transmissions, at frequencies greater than the analog transmission, and where crosstalk interference with other signals is possible, the improvement comprising:
    means for time compressing multiple bit blocks of the digital data information so that the frequency rate of the digital data signal transmitted is greater than the frequencies of the analog signal;
    means for spreading the energy of the time compressed digital data signal over a spectrum of frequencies, all greater than the frequencies of the analog signal, so that crosstalk interference with other signals is minimized;
    means for coupling the digital data signal to the communications medium so that the spectrum of frequencies can be transmitted simultaneously with the analog signal at data transmission frequencies greater than the frequencies of analog signal; and
    means for isolating the spectrum of time compressed digital data signal frequencies from the frequencies of the analog signal so that the high frequency data signal does not interfere with the analog transmission.

2. The improvement of claim 1 wherein the means for time compressing the digital data information comprises means for time compression multiplexing the digital data information so that duplex transmission is possible.

3. The communications system of claim 1 wherein the improvement further comprises means for combining the data information with a pseudo random code to spread the data signal over a range of frequencies, all higher than the frequencies of the analog signal.

4. The communications system of claim 1 wherein the improvement further comprises means for block encoding the digital data information so that errors caused by transmitting the digital data information can be corrected.

5. The communications system of claim 1 wherein the communications system comprises means for generating digital data and wherein the improvement further comprises:
 means for transmitting digital data information in four bit segments; and
 means for block encoding the four bit digital data information into seven bit code words so that errors in the transmission of the digital data can be corrected.

6. The communications system of claim 5 wherein the improvement further comprises:
 means for interleaving individual bits of each seven bit code word so that corresponding bits of each individual seven bit code word are sequentially transmitted before the next set of corresponding bits of the code word so that transients on the communications medium affect only a single bit of the seven bit code word.

7. The improvement of claim 3 wherein the means for combining the data signal with a pseudo random code comprise:
 a pseudo random code generator; and
 means for combining the pseudo random code generated by the pseudo random code generator with the digital data signal so that the frequency of transmission is spread over a range of frequencies, all frequencies greater than the frequencies of the analog signal.

8. The improvement of claim 7 wherein the analog signal is a voice communication which is transmitted in the frequency range of zero to three kilohertz and wherein the digital data signal is transmitted in the frequency range of approximately thirty to one hundred and twenty kilohertz.

9. The communications system of claim 1 wherein the improvement further comprises:
 a receiver for receiving the transmitted digital data information; and
 means for synchronizing the transmission so that it is accurately received by the receiver.

10. The communications system of claim 1 wherein the improvement further comprises a biphase encoder for further encoding the seven bit code word so that each bit of the seven bit code word is actually transmitted as two different logic levels.

11. The improvement of claim 1 wherein the analog signal is a voice signal and wherein the means for isolating the digital data signal from the analog signal is a low pass filter in the voice path of the communications system.

12. The communications system of claim 1 wherein the improvement further comprises a receiver for receiving the digital data information.

13. The improvement of claim 12 wherein the coupling means further comprises means for coupling the received digital data signal to the receiver.

14. The improvement of claim 12 wherein the receiver further comprises means for filtering analog information from the digital data signal.

15. The improvement of claim 12 wherein the receiver further comprises means for amplifying the received signal and means for correcting the slope of the received signal so that digital data signals transmitted over long distances can be decoded by the receiver.

16. The improvement of claim 12 wherein the receiver further comprises means for detecting the transmission of the digital data signal.

17. The improvement of claim 16 wherein the means for detecting the receipt of a transmitted digital data signal comprises a coarse acquisition circuit that detects the envelope of the digital data signal.

18. The improvement of claim 12 wherein the receiver comprises means for detecting the logic level of each bit transmitted as part of the digital data signal.

19. The improvement of claim 12 wherein the receiver further comprises:
 a clock; and
 a means for detecting the phase of the received digital data signal relative to the receiver clock.

20. The improvement of claim 19 wherein the receiver further comprises:
 means for adjusting the phase of the received digital data signal relative to the clock frequency of the receiver.

21. The communications system of claim 10 wherein the improvement further comprises:
 a receiver for receiving the digital data information; and
 a biphase decoder for decoding the digital data signal.

22. The communications system of claim 7 wherein the improvement further comprises:
 a receiver for receiving the digital data signal; and wherein the receiver comprises:
 a pseudo random generator which is set to the same code as the first pseudo random generator; and
 a means for combining the pseudo random code generated by the second pseudo random code generator with the digital data signal received so that the pseudo random code is removed from the digital data signal.

23. The communications system of claim 6 wherein the improvement further comprises:
 a receiver for receiving the digital data signal; and
 a bit de-interleaver which receives each of the sequentially transmitted bits of each code word and generates therefrom the individual seven bit code words transmitted by the transmitting means.

24. The communications system of claim 5 wherein the improvement further comprises a receiver for receiving the digital data signal and wherein the receiver comprises:
 a means for decoding each of the seven bit code words transmitted into the four bit bits of digital data information transmitted.

25. The improvement of claim 24 wherein the means for decoding each of the code words comprises a block decoder and wherein the block decoder further comprises:
 means for indicating errors detected by the block decoder and wherein the improvement further comprises; means for counting the errors detected by the block decoder; and
 means for resynchronizing the receiver if a predetermined number of errors are detected by the block decoder.

26. The improvement of claim 12 wherein the communications system further comprises a second data terminal for receiving and displaying the digital data information and wherein the improvement further comprises:

a means for coupling the received digital data information to the data terminal.

27. The improvement of claim 1 further comprising means for transmitting the data information with a synchronous format.

28. The improvement of claim 1 further comprising means for transmitting the data information with an asynchronous format.

29. In a method for communication of digital data information on the same communications medium as analog transmissions, at frequencies greater than the analog transmission, and where crosstalk interference with other signals is possible, the improvement comprising:
   time compressing multiple bit blocks of the digital data information so that the frequency rate of the digital data signal transmitted is greater than the frequencies of the analog signal;
   spreading the spectral energy of the digital data signal over a spectrum of frequencies greater than the frequencies of the analog signal so that crosstalk interference with other signals is minimized;
   coupling the digital data signal to the communications medium so it can be transmitted simultaneously with the analog signal; and
   isolating the digital data signal from the analog signal so that the high frequency data signal does not interfere with the analog transmission.

30. The improvement of claim 29 wherein the step for time compressing the digital data information comprises time compression multiplexing the digital data information so that duplex transmission is possible.

31. The method of claim 29 wherein the improvement further comprises combining the data information with a pseudo random code to spread the data signal over a range of frequencies, all higher than the frequencies of the analog signal.

32. The method of claim 29 wherein the improvement further comprises block encoding the digital data information so that errors caused by transmitting the digital data information can be corrected.

33. The method of claim 29 wherein the method comprises generating digital data and wherein the improvement further comprises:
   transmitting digital data information in four bit segments; and
   block encoding the four bit digital data information into seven bit code words so that errors in the transmission of the digital data can be corrected.

34. The method of claim 33 wherein the improvement further comprises:
   interleaving individual bits of each seven bit code word so that corresponding bits of each individual seven bit code word are sequentially transmitted before the next set of corresponding bits of the code word so that transients on the communications medium affect only a single bit of the seven bit code word.

35. The improvement of claim 29 wherein the analog signal is a voice communication which is transmitted in the frequency range of zero to three kilohertz and wherein the digital data signal is transmitted in the frequency range of approximately thirty to one hundred and twenty kilohertz.

36. The method of claim 29 wherein the improvement further comprises:
   receiving the transmitted digital data information; and
   synchronizing the transmission so that it is accurately received.

37. The method of claim 29 wherein the improvement comprises further encoding the seven bit code word with a biphase encoder so that each bit of the seven bit code word is actually transmitted as two different logic levels.

38. The method of claim 29 wherein the analog signal is a voice signal and wherein the improvement further comprises isolating the digital data signal from the analog signal with a low pass filter in the voice path of the communications system.

39. The method of claim 29 wherein the improvement further comprises receiving the digital data information.

40. The improvement of claim 39 further comprising coupling the received digital data signal to the receiver.

41. The improvement of claim 39 further comprising filtering analog information from the digital data signal.

42. The improvement of claim 39 further comprising amplifying the received signal and correcting the slope of the received signal so that digital data signals transmitted over long distances can be decoded.

43. The improvement of claim 39 further comprising detecting the transmission of the digital data signal.

44. The improvement of claim 43 wherein the step of detecting the receipt of a transmitted digital data signal comprises the step of detecting the envelope of the digital data signal.

45. The improvement of claim 39 further comprising the step of detecting the logic level of each bit transmitted as part of the digital data signal.

46. The improvement of claim 39 further comprising the steps of:
   generating a receiver clock frequency; and
   detecting the phase of the received digital data signal relative to the receiver clock.

47. The improvement of claim 46 further comprising the step of adjusting the phase of the received digital data signal relative to the clock frequency of the receiver.

48. The method of claim 31 wherein the improvement further comprises:
   receiving the digital data signal; generating a second pseudo random code which is the same as the first pseudo random code; and
   combining the second pseudo random code with the digital data signal received so that the pseudo random code is removed from the digital data signal.

49. The method of claim 34 wherein the improvement further comprises:
   receiving the digital data signal; and
   de-interleaving each of the sequentially transmitted bits of each code word and generating therefrom the individual seven bit code words transmitted by the transmitting means.

50. The method of claim 33 wherein the improvement further comprises:
   receiving the digital data signal; and
   block decoding each of the seven bit code words transmitted into the four bit bits of digital data information transmitted.

51. The improvement of claim 50 wherein the improvement further comprises:
   indicating errors detected during the step of block decoding;
   counting the errors detected during the step of block decoding; and resychronizing the receiver if a predetermined number of errors are detected during the step of block decoding.

52. The improvement of claim 29 further comprising transmitting the data information with a synchronous format.

53. The improvement of claim 29 further comprising transmitting the data information with an asynchronous format.

* * * * *